(12) United States Patent
Nagatani et al.

(10) Patent No.: US 11,233,393 B2
(45) Date of Patent: Jan. 25, 2022

(54) IC CHIP

(71) Applicant: NIPPON TELEGRAPH AND TELEPHONE CORPORATION, Tokyo (JP)

(72) Inventors: Munehiko Nagatani, Tokyo (JP); Hideyuki Nosaka, Tokyo (JP); Shinsuke Nakano, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/769,201

(22) PCT Filed: Dec. 13, 2018

(86) PCT No.: PCT/JP2018/045860
§ 371 (c)(1),
(2) Date: Jun. 2, 2020

(87) PCT Pub. No.: WO2019/124211
PCT Pub. Date: Jun. 27, 2019

(65) Prior Publication Data
US 2021/0175706 A1    Jun. 10, 2021

(30) Foreign Application Priority Data

Dec. 18, 2017    (JP) .............................. JP2017-241532

(51) Int. Cl.
*H02H 9/04*    (2006.01)
*H03H 7/01*    (2006.01)

(52) U.S. Cl.
CPC .......... *H02H 9/046* (2013.01); *H03H 7/0138* (2013.01)

(58) Field of Classification Search
CPC ........ H02H 9/046; H03H 7/0138; H03H 7/06; H04B 1/00; H04B 3/02
(Continued)

(56) References Cited

U.S. PATENT DOCUMENTS

2008/0136728 A1    6/2008  Banba
2009/0128249 A1*   5/2009  Katta ....................... H03H 7/38
                                                              333/17.1
(Continued)

FOREIGN PATENT DOCUMENTS

CN    1167367 A    12/1997
CN    1663132 A    8/2005
(Continued)

OTHER PUBLICATIONS

International Preliminary Report on Patentability received for PCT Patent Application No. PCT/JP2018/045860, dated Jul. 2, 2020, 15 pages (9 pages of English Translation and 6 pages of Original Document).
(Continued)

*Primary Examiner* — Dharti H Patel
(74) *Attorney, Agent, or Firm* — Womble Bond Dickinson (US) LLP

(57) ABSTRACT

A reception-side IC chip (1a) includes a pad (15) which is connected to a transmission line (2) which is outside the chip and has a characteristic impedance Z0 of 50Ω, a signal line (16), one end of which is connected to the pad (15), a reception-side input unit circuit (10) configured to receive a signal (S) transmitted from a transmission-side IC chip via the transmission line (2), a 50-Ω termination resistor (11), for impedance matching, which is connected between a predetermined voltage and the other end of the signal line (16) and is configured to terminate the transmission line (2), and a capacitor (12) inserted between a node (A) of the
(Continued)

signal line (16) and the termination resistor (11) and an input terminal (In) of the reception-side input unit circuit (10). A DC-blocking circuit is formed by the capacitor (12).

13 Claims, 28 Drawing Sheets

(58) Field of Classification Search
USPC .......................................................... 361/56
See application file for complete search history.

(56) References Cited

U.S. PATENT DOCUMENTS

| | | | | |
|---|---|---|---|---|
| 2010/0178878 | A1* | 7/2010 | Kurioka | H01G 4/40 455/73 |
| 2012/0019968 | A1* | 1/2012 | Hsieh | H01L 27/0288 361/56 |
| 2013/0002347 | A1 | 1/2013 | Beukema et al. | |

FOREIGN PATENT DOCUMENTS

| | | |
|---|---|---|
| CN | 101807884 A | 8/2010 |
| EP | 0785590 A1 | 7/1997 |
| JP | 09-200077 A | 7/1997 |
| JP | 2008-085987 A | 4/2008 |
| JP | 2010-028695 A | 2/2010 |
| JP | 2011-009853 A | 1/2011 |
| JP | 2016-162804 A | 9/2016 |
| KR | 10-0261751 B1 | 7/2000 |

OTHER PUBLICATIONS

International Search Report and Written Opinion received for PCT Patent Application No. PCT/JP2018/045860, dated Feb. 12, 2019, 15 pages (8 pages of English Translation and 7 pages of Original Document).

Wakita et al., "36-GHz-Bandwidth Quad-channel Driver Module using Compact QFN Package for Optical Coherent Systems", Electrical Performance of Electronic Packaging and Systems (EPEPS), IEEE, 2015, pp. 213-215.

Notice of Reasons for Refusal received for Japanese Patent Application No. 2019-561017 dated May 25, 2020, 10 pages (5 pages of English Translation and 5 pages of Original Document).

* cited by examiner

IC CHIP

TECHNICAL FIELD

The present invention relates to an IC chip which includes a compact wideband DC-blocking circuit.

BACKGROUND ART

When high-speed electrical signal communication is performed between ICs (Integrated Circuits), the ICs are generally connected by a transmission line (transmission medium) in which a characteristic impedance Z0 is 50Ω. A 50-Ω resistor for impedance matching is arranged on each of the transmission-end side and the reception-end side of the transmission line. In a case in which there is a difference between the operation voltage (DC operating point) of a transmission-side IC and the operation voltage of a reception-side IC, a DC-blocking capacitor that cuts off the DC component of a signal is arranged between the ICs.

FIG. 33 shows an example of a general signal transmission/reception arrangement which includes a DC-blocking capacitor. In the example shown in FIG. 33, a transmission-side circuit 10-1 and a 50-Ω resistor 11-1 for impedance matching are arranged in a transmission-side IC 1-1, and a reception-side circuit 10-2 and a 50-Ω resistor 11-2 for impedance matching are arranged in a transmission-side IC 1-2. The IC 1-1 and the IC 1-2 are connected by a transmission line 101, and a DC-blocking capacitor 3 is arranged in the middle of the transmission line 101.

In the example shown in FIG. 33, since the DC-blocking capacitor 3 and the 50-Ω resistor 11-2 on the reception-side form a high-pass filter, a low frequency component which includes the DC components of the signal is cut off (blocked). However, in the case of an application that handles a baseband signal having a wide band which ranges from several Gbps to several ten Gbps, a signal frequency component of about 1 MHz or more needs to be passed, thus creating a need to set the cutoff frequency of the high-pass filter to about 1 MHz or less.

The transfer function of a high-pass filter using a capacitor C and a resistor R as shown in FIG. 34 is as follows.

$$V\text{out}(s)/V\text{in}(s)=1/\{1+(1/sCR)\} \quad (1)$$

According to equation (1), it can be seen that, when the value of the resistor R is a fixed value of 50Ω to ensure impedance matching, the capacitor C needs to be set to about 5 nF or more (nF order) to implement a cutoff frequency of about 1 MHz. It is difficult, in terms of the dedicated area, to manufacture an nF-order capacitor on a chip by a general semiconductor process, and a DC-blocking capacitor needs to be mounted externally (off the chip) (see non-patent literature 1).

However, since the size of an external capacitor is several hundred μm to mm square, it problematically inhibits the downsizing of a module or the like that incorporates the external capacitor.

RELATED ART LITERATURE

Non-Patent Literature

Non-Patent Literature 1: H. Wakita, et al., "36-GHz-Bandwidth Quad-channel Driver Module using Compact QFN Package for Optical Coherent Systems", Electrical Performance of Electronic Packaging and Systems (EPEPS), 2015

DISCLOSURE OF INVENTION

Problem to be Solved by the Invention

The present invention has been made to solve the above-described problem and has as its object to implement a compact wideband DC-blocking circuit that can be mounted on an IC chip while ensuring impedance matching.

Means of Solution to the Problem

An IC chip according to the present invention is an IC chip characterized by comprising: a pad connected to a first transmission line outside the chip; a signal line, one end of which is connected to the pad; a termination resistor connected to the other end of the signal line and configured to terminate the first transmission line; a reception-side input unit circuit configured to receive a signal transmitted from a transmission-side via the first transmission line; and a capacitor inserted between a node of the signal line and the termination resistor and an input terminal of the reception-side input unit circuit.

Effect of the Invention

According to the present invention, a compact wideband DC-blocking circuit that can be mounted on an IC Chip can be implemented by arranging a capacitor between an input terminal of a reception-side input unit circuit and a node, between a signal line and a termination resistor, of the IC chip. As a result, the present invention can implement an IC chip that includes a compact wideband DC-blocking circuit.

BEST MODE FOR CARRYING OUT THE INVENTION

In order to solve the above-described problem, the present invention provides a compact wideband DC-blocking circuit that can be mounted on an IC chip while ensuring 50-Ω impedance matching. In the present invention, a blocking capacitor, which is conventionally arranged on a transmission line between a transmission-side IC chip and a reception-side IC chip, is arranged on the reception-side IC chip.

First Embodiment

Figure 1:
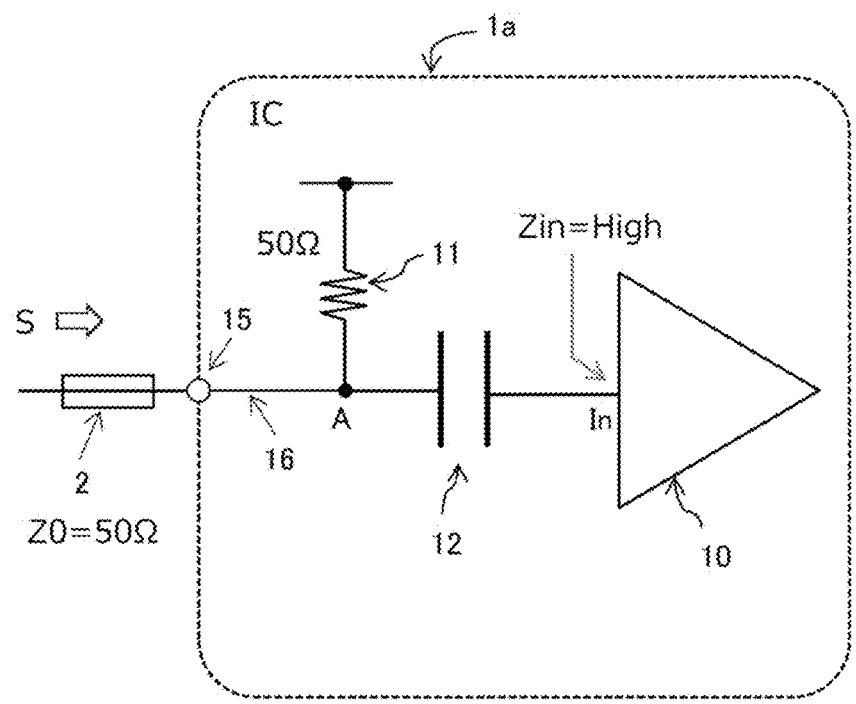
FIG. 1 is a circuit diagram showing the arrangement of a reception-side IC chip according to the first embodiment of the present invention.

Embodiments of the present invention will be described hereinafter with reference to the attached drawings. FIG. 1 is a circuit diagram showing a reception-side IC chip according to the first embodiment of the present invention. A reception-side IC chip 1a at least includes a pad 15 connected to a transmission line 2 whose characteristic impedance Z0 from outside the chip is 50Ω, a signal line 16, one end of which is connected to the pad 15, a reception-side input unit circuit 10 that receives a signal S transmitted from a transmission-side IC chip (not shown) via the transmission line 2, a 50-Ω termination resistor 11 for impedance matching that is connected between a predetermined voltage and the other end of the signal line 16 and terminates the transmission line 2, and a capacitor 12 inserted between a node A of the signal line 16 and the termination resistor 11 and an input terminal In of the reception-side input unit circuit 10.

In such reception-side IC chip 1a, an on-chip DC-blocking circuit according this embodiment is formed by the capacitor 12.

In this embodiment, an input impedance Zin of the reception-side input unit circuit 10 needs to be increased to make the capacitor 12 be of a size that can be mounted on a chip. The degree to which the input impedance Zin is to be set will be described later.

Second Embodiment

Figure 2:
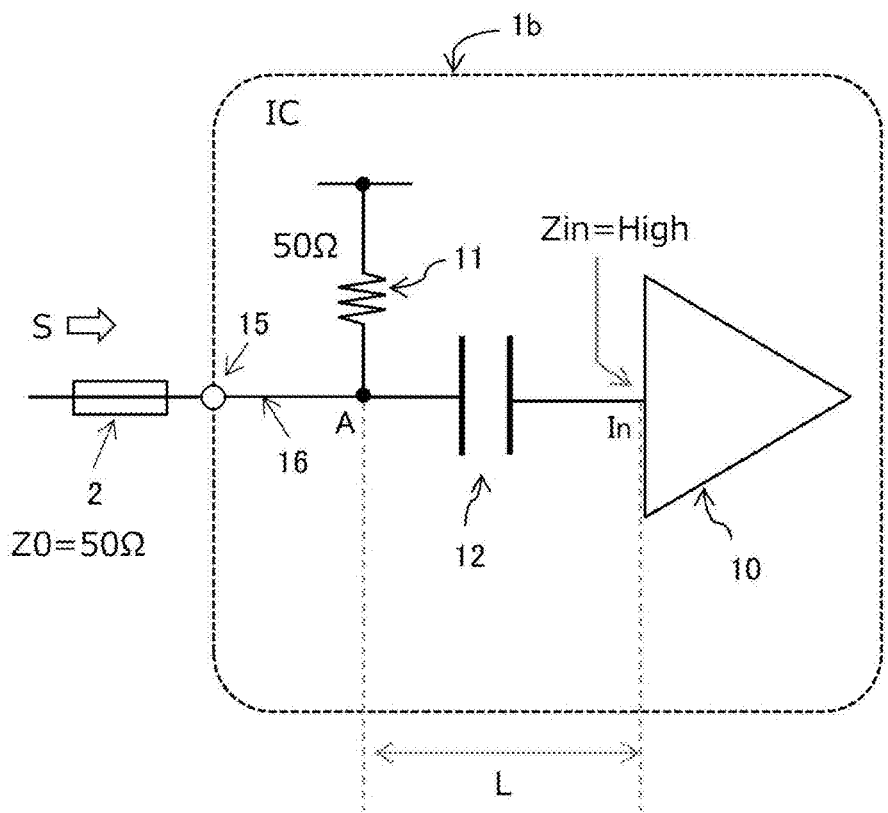
FIG. 2 is a circuit diagram showing the arrangement of a reception-side IC chip according to the second embodiment of the present invention.

The Second embodiment of the present invention will be described next. FIG. 2 is a circuit diagram showing the arrangement of a reception-side IC chip according to the second embodiment of the present invention. A reception-side IC chip 1b according to this embodiment has the same arrangement as the first embodiment, but is characterized in that a length L from a node A of a signal line 16 and a termination resistor 11 to an input terminal In of a reception-side input unit circuit 10 is sufficiently shorter than the wavelength of a maximum frequency component of a signal S handled by the reception-side IC chip 1b (reception-side input unit circuit 10).

For example, the length L can be set to be less than 1/20 of the wavelength of the maximum frequency component of the signal S handled by the reception-side IC chip 1b (reception-side input unit circuit 10). In general, it is known that a circuit whose length L is of a size less than 1/20 of a signal wavelength can be handled as a lumped constant circuit. That is, as long as the size is less than 1/20 of the signal wavelength, the signal waveform will not be influenced even under a state in which a reflected wave or the like will occur.

Third Embodiment

Figure 3:
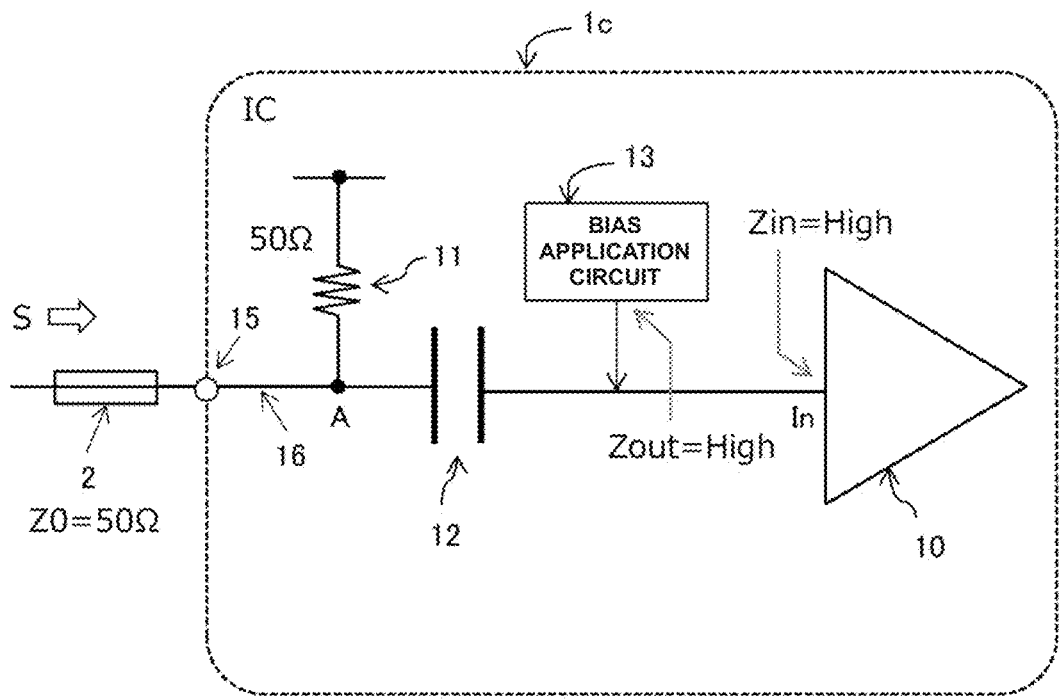
FIG. 3 is a circuit diagram showing the arrangement of a reception-side IC chip according to the third embodiment of the present invention.

The third embodiment of the present invention will be described next. FIG. 3 is a circuit diagram showing the arrangement of a reception-side IC chip according to the third embodiment of the present invention. A reception-side IC chip 1c according to this embodiment is obtained by adding, to the arrangement of the first embodiment, a bias application circuit 13 that applies a DC bias voltage to an input terminal In of a reception-side input unit circuit 10.

In this embodiment, in order to make a capacitor 12 of an on-chip DC-blocking circuit be of a size that can be mounted on a chip, an input impedance Zin of the reception-side input unit circuit 10 and an output impedance Zout of the bias application circuit 13 need to be increased. The degrees to which the input impedance Zin and the output impedance Zout are to be set will be described later.

Fourth Embodiment

Figure 4:
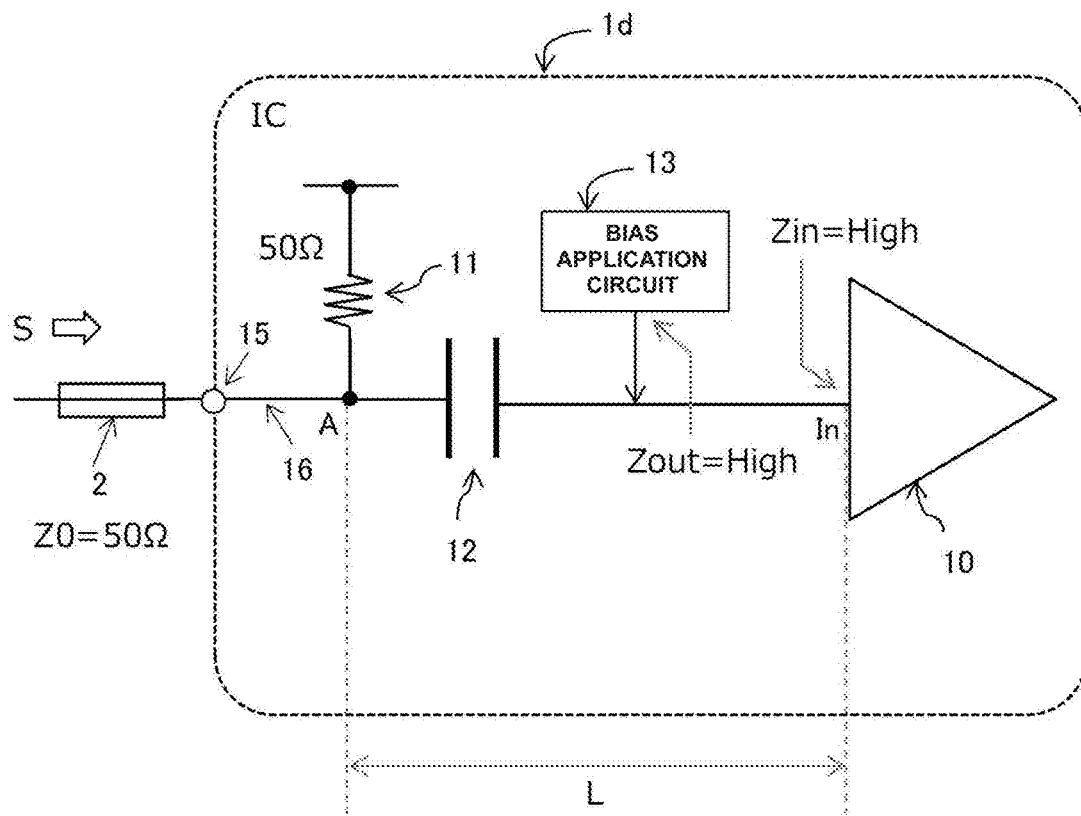
FIG. 4 is a circuit diagram showing the arrangement of a reception-side IC chip according to the fourth embodiment of the present invention.

The fourth embodiment of the present invention will be described next. FIG. 4 is a circuit diagram showing the arrangement of a reception-side IC chip according to the fourth embodiment of the present invention. A reception-side IC chip 1d according to this embodiment has the same arrangement as the third embodiment, but is characterized in that a length L from a node A of a signal line 16 and a termination resistor 11 to an input terminal In of a reception-side input unit circuit 10 is sufficiently shorter than the wavelength of a maximum frequency component of a signal S handled by the reception-side IC chip 1d (reception-side input unit circuit 10). In the same manner as the third embodiment, the length L can be set to be less than 1/20 of the wavelength of the maximum frequency component of the signal S handled by the reception-side IC chip 1d (reception-side input unit circuit 10).

Figure 34:
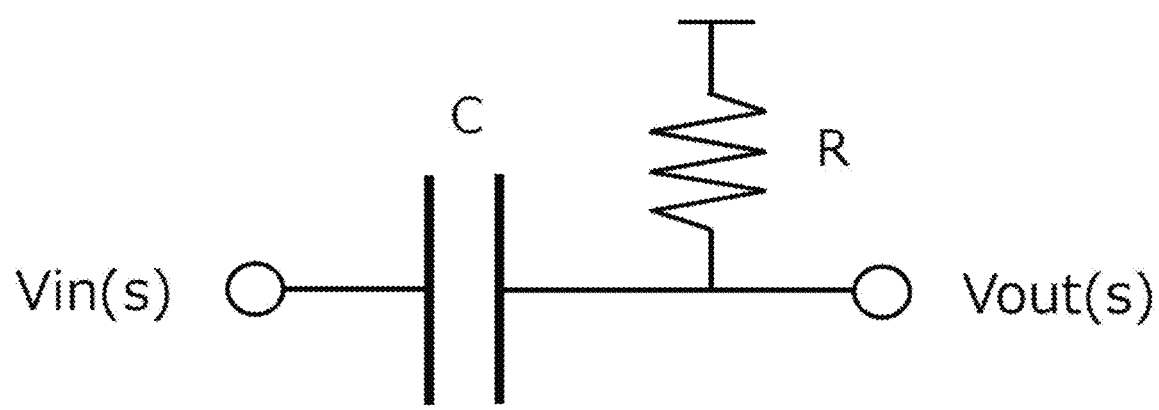
FIG. 34 is a view for explaining the arrangement and a transfer coefficient of a high-pass filter.

As described above, by using a DC-blocking circuit arrangement that has the characteristics described in the first to fourth embodiments, impedance matching by the 50-Ω termination resistor 11 arranged before a capacitor 12 can be ensured and a resistance value R, as indicated in the circuit shown in FIG. 34, can be designed to be sufficiently large when the reception-side input unit circuit 10 is viewed from the node A of the signal line 16 and the termination resistor 11. As a result, the cutoff frequency of a high-pass filter can be extended to a low frequency range even if the value of the capacitor 12 is reduced.

For example, in the case of the first and second embodiments, a high-pass filter is formed by the capacitor 12 and an input impedance Zin of the reception-side input unit circuit 10. The input impedance Zin (the value of the resistor R) can be set based on equation (1) so that the cutoff frequency of the high-pass filter and the capacitance of the capacitor 12 become desired values, respectively.

Also, in the case of the third and fourth embodiments, a high-pass filter is formed by the capacitor 12 and a combined resistance of the input impedance Zin of the reception-side input unit circuit 10 and an output impedance Zout of a bias application circuit 13. The input impedance Zin and the output impedance Zout can be set so that the cutoff frequency of the high-pass filter and the capacitance of the capacitor 12 become desired values, respectively. For example, if the combined resistance value of the input impedance Zin of the reception-side input unit circuit 10 and the output impedance Zout of the bias application circuit 13 is designed to be about 1 MΩ, the capacitance value of the capacitor 12 necessary to implement a cutoff frequency of 1 MHz can be 1 pF or less. That is, the capacitor 12 will be of a size that can be mounted on a chip.

In addition, in the second and fourth embodiments, by designing the length L from the node A of the signal line 16 and the termination resistor 11 to the input terminal In of the reception-side input unit circuit 10 to be sufficiently shorter than the wavelength of the maximum frequency component of the signal S to be handled, characteristic degradation (the influence from the reflection due to impedance mismatch between the node A and the reception-side input unit circuit 10) at the high-frequency range can be suppressed.

As described above, by using the circuit arrangements according to the first to fourth embodiments, a compact wideband DC-blocking circuit which is mountable on an IC chip can be implemented while ensuring 50-Ω impedance matching.

Fifth Embodiment

Figure 5:
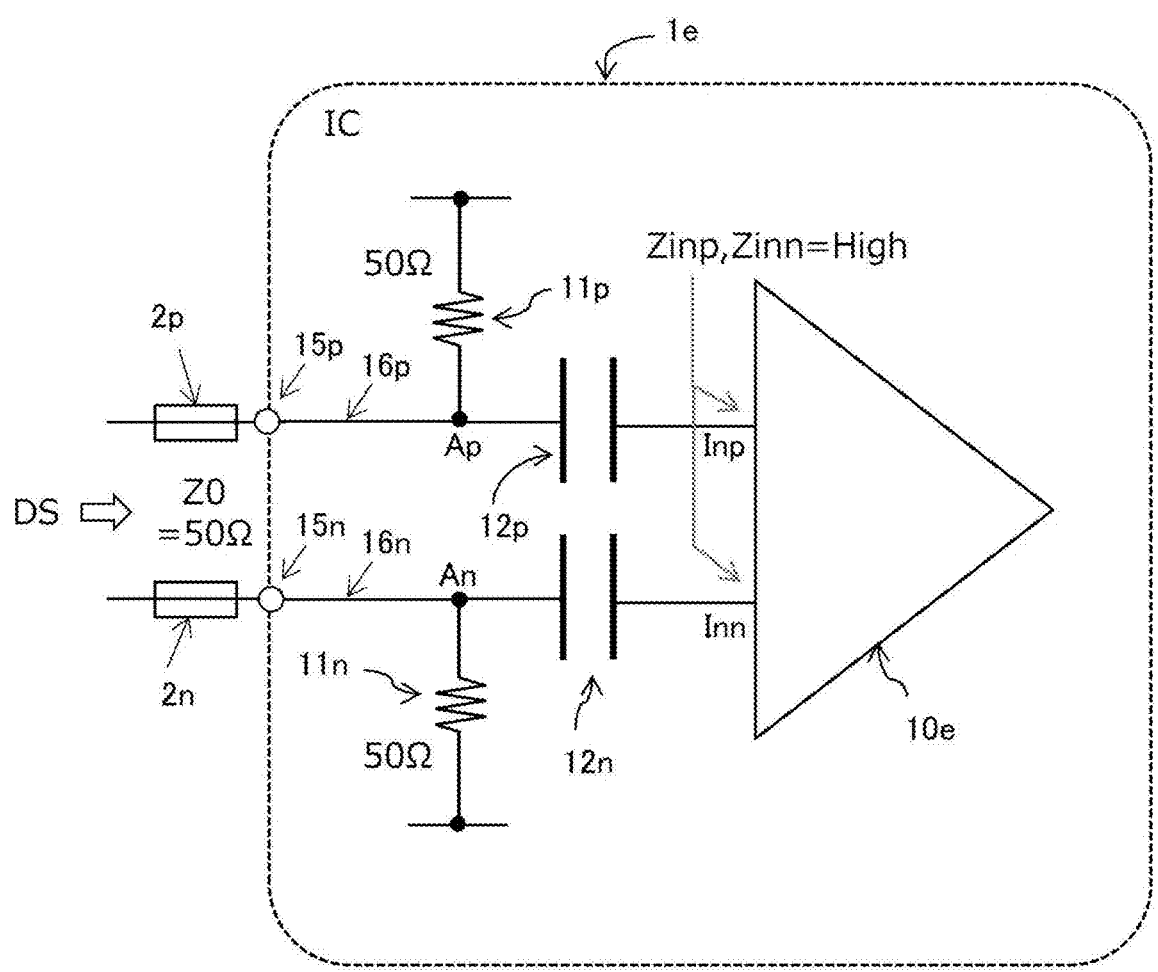
FIG. 5 is a circuit diagram showing the arrangement of a reception-side IC chip according to the fifth embodiment of the present invention.

Although the first to fourth embodiments showed examples of application to a circuit that handles a single-phase signal S, the present invention can also be applied to a differential circuit. FIG. 5 is a circuit diagram showing the arrangement of a reception-side IC chip according to the fifth embodiment of the present invention. A reception-side IC chip 1e at least includes a pad 15p connected to a non-inverting-side transmission line 2p whose characteristic impedance Z0 is 50Ω, a pad 15n connected to an inverting-side transmission line 2n whose characteristic impedance Z0 is 50Ω, a signal line 16p, one end of which is connected to the pad 15p, a signal line 16n, one end of which is connected to the pad 15n, a reception-side input unit circuit 10e which receives a differential signal DS from a transmission-side IC chip (not shown) via the transmission lines 2p and 2n having a differential arrangement, a 50-Ω termination resistor 11p for impedance matching which is connected between a predetermined voltage and the other end of the signal line 16p and terminates the transmission line 2p, a 50-Ω termination resistor 11n for impedance matching which is connected between a predetermined voltage and the other end of the signal line 16n and terminates the transmission line 2n, a capacitor 12p inserted between a non-inverting input terminal Inp of the reception-side input unit circuit 10e and a node Ap of the signal line 16p and the termination resistor 11p, and a capacitor 12n inserted between an inverting input terminal Inn of the reception-side input unit circuit 10e and a node An of the signal line 16n and the termination resistor 11n.

In such reception-side IC chip 1e, an on-chip DC-blocking circuit according to this embodiment is formed by the capacitors 12p and 12n.

In this embodiment, to make each of the capacitors 12p and 12n be of a size that can be mounted on a chip, the non-inverting-side input impedance Zinp and the inverting-side input impedance Zinn of the reception-side input unit circuit 10e need to be increased. The degrees to which the input impedances Zinp and Zinn are to be set will be described later.

Figure 6:
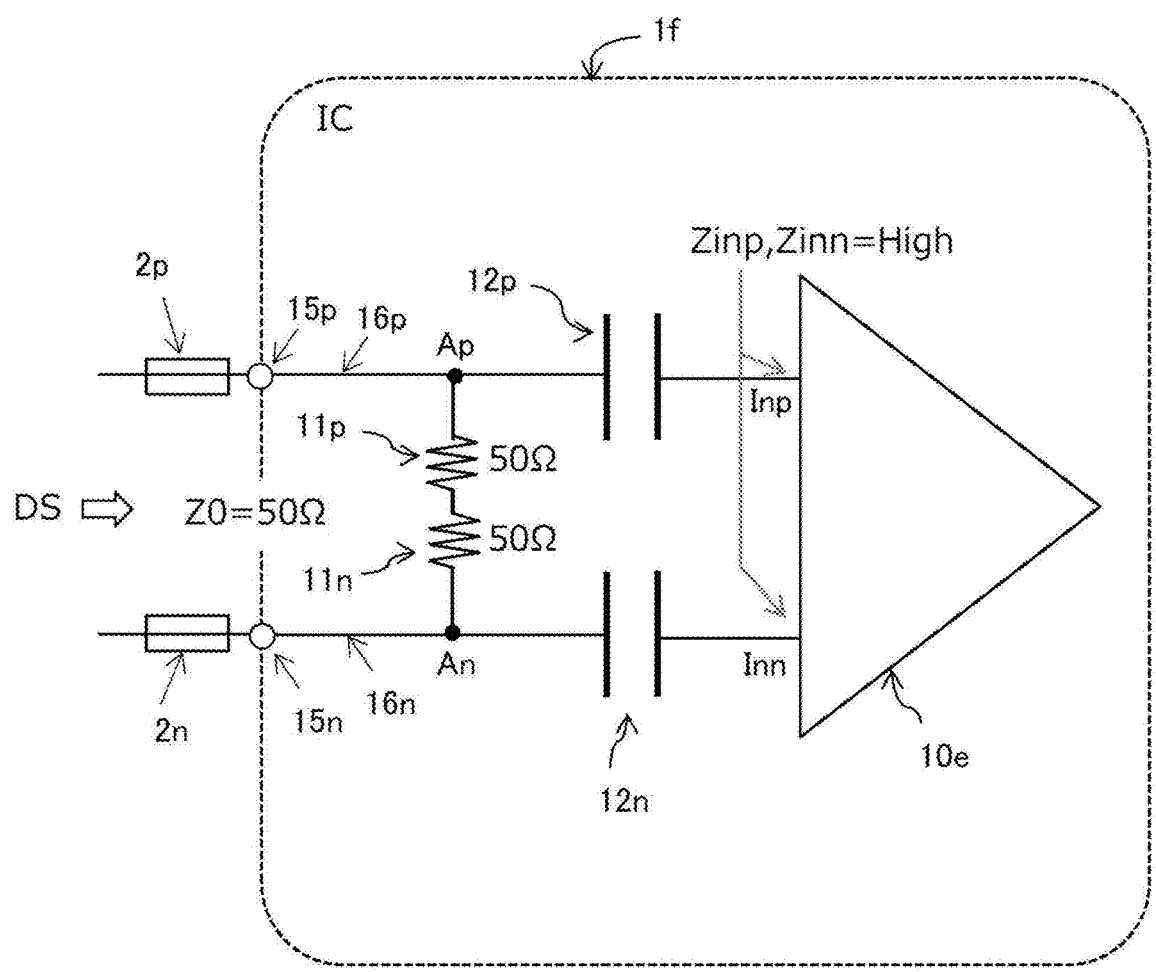
FIG. 6 is a circuit diagram showing another arrangement of the reception-side IC chip according to the fifth embodiment of the present invention.

Note that the termination resistors 11p and 11n for impedance matching in the differential circuit can be arranged in several kinds of ways, and may be arranged as a T-shaped termination, as shown in FIG. 5, as a measure against common mode noise or may be arranged as a n-shaped termination as a reception-side IC chip 1f as shown in FIG. 6.

Sixth Embodiment

Figure 7:
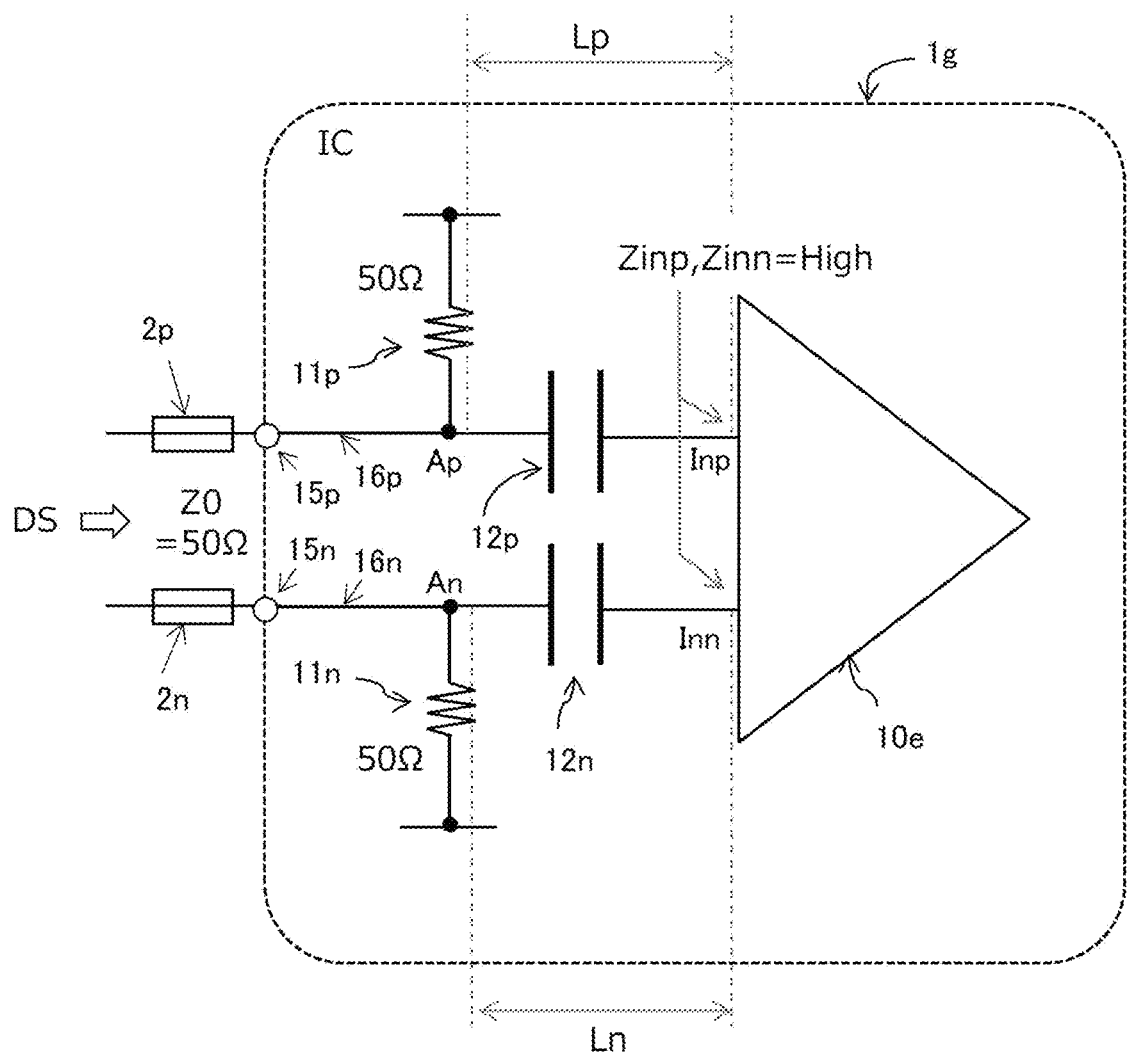
FIG. 7 is a circuit diagram showing the arrangement of a reception-side IC chip according to the sixth embodiment of the present invention.

The sixth embodiment of the present invention will be described below. FIG. 7 is a circuit diagram showing the arrangement of a reception-side IC chip according to the sixth embodiment of the present invention. A reception-side IC chip 1g according to this embodiment has the same arrangement as the fifth embodiment, but is characterized in that a length Lp, from a node Ap of a non-inverting-side signal line 16p and a termination resistor 11p to a non-inverting input terminal Inp of a reception-side input unit circuit 10e, and a length Ln, from a node An of an inverting-side signal line 16n and a termination resistor 11n to an inverting input terminal Inn of the reception-side input unit circuit 10e will be sufficiently shorter than the wavelength of the maximum frequency component of a signal DS handled by the reception-side IC chip 1g (reception-side input unit circuit 10e).

In the same manner as the second embodiment, the lengths Lp and Ln can be set to be less than 1/20 of the wavelength of the maximum frequency component of the signal DS handled by the reception-side IC chip 1g (reception-side input unit circuit 10e).

Figure 8:
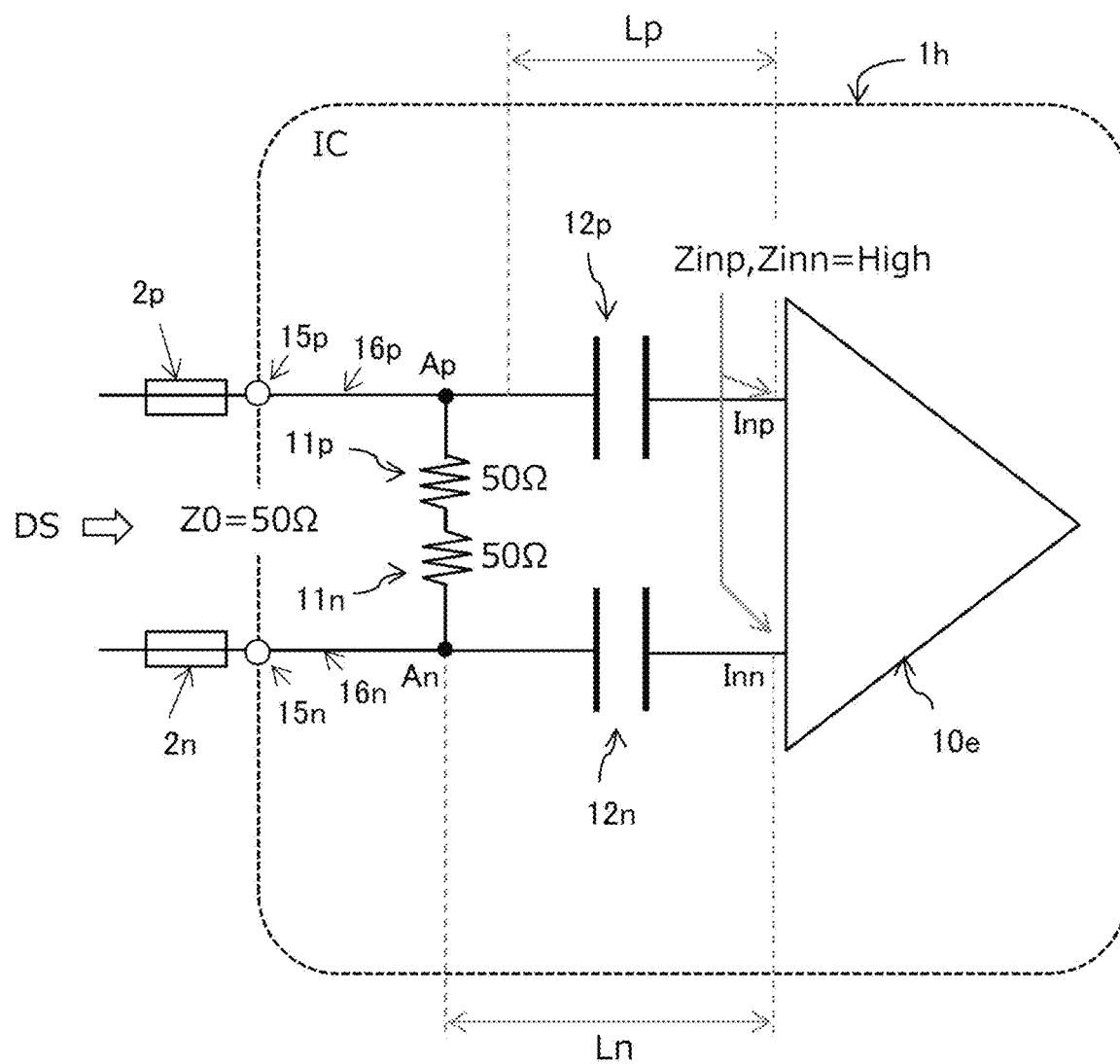
FIG. 8 is a circuit diagram showing another arrangement of the reception-side IC chip according to the sixth embodiment of the present invention.

As described in the fifth embodiment, a T-shaped termination, as shown in FIG. 7, may be arranged as a measure against common mode noise or a n-shaped termination as that of a reception-side IC chip 1h shown in FIG. 8 may be arranged.

Seventh Embodiment

Figure 9:
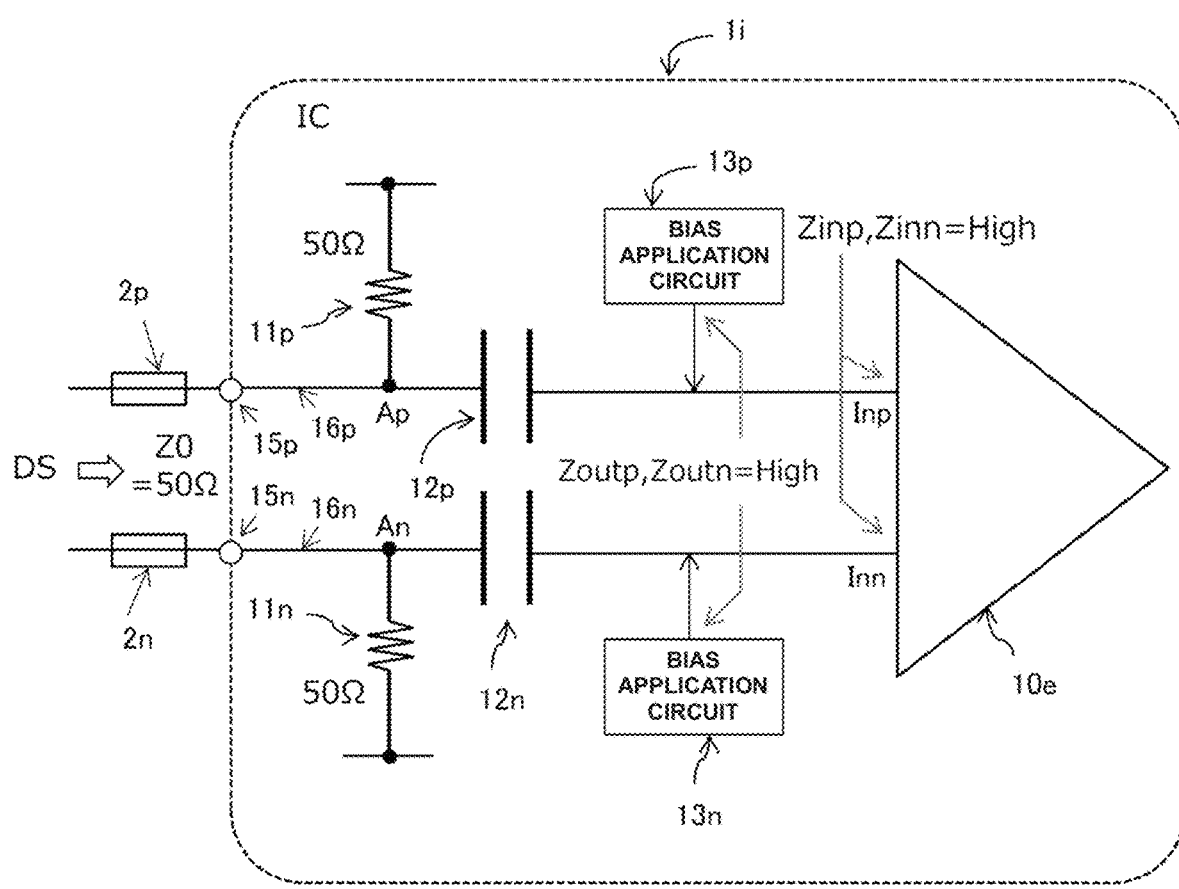
FIG. 9 is a circuit diagram showing the arrangement of a reception-side IC chip according to the seventh embodiment of the present invention.

The seventh embodiment of the present invention will be described next. FIG. 9 is a circuit diagram showing the arrangement of a reception-side IC chip according to the seventh embodiment of the present invention. A reception-side IC chip 1i according to the embodiment is obtained by adding, to the arrangement of the fifth embodiment, a bias application circuit 13p, which applies a DC bias voltage to a non-inverting input terminal Inp of the reception-side input unit circuit 10e, and a bias application circuit 13n, which applies a DC bias voltage to a inverting input terminal Inn of the reception-side input unit circuit 10e.

In this embodiment, to make capacitors 12p and 12n be of a size that can be mounted on a chip, input impedances Zinp and Zinn of the reception-side input unit circuit 10e and output impedances Zoutp and Zoutn of the bias application circuits 13p and 13n need to be increased. The degrees to which the input impedances Zinp and Zinn and the output impedances Zoutp and Zoutn are to be set will be described later.

Figure 10:
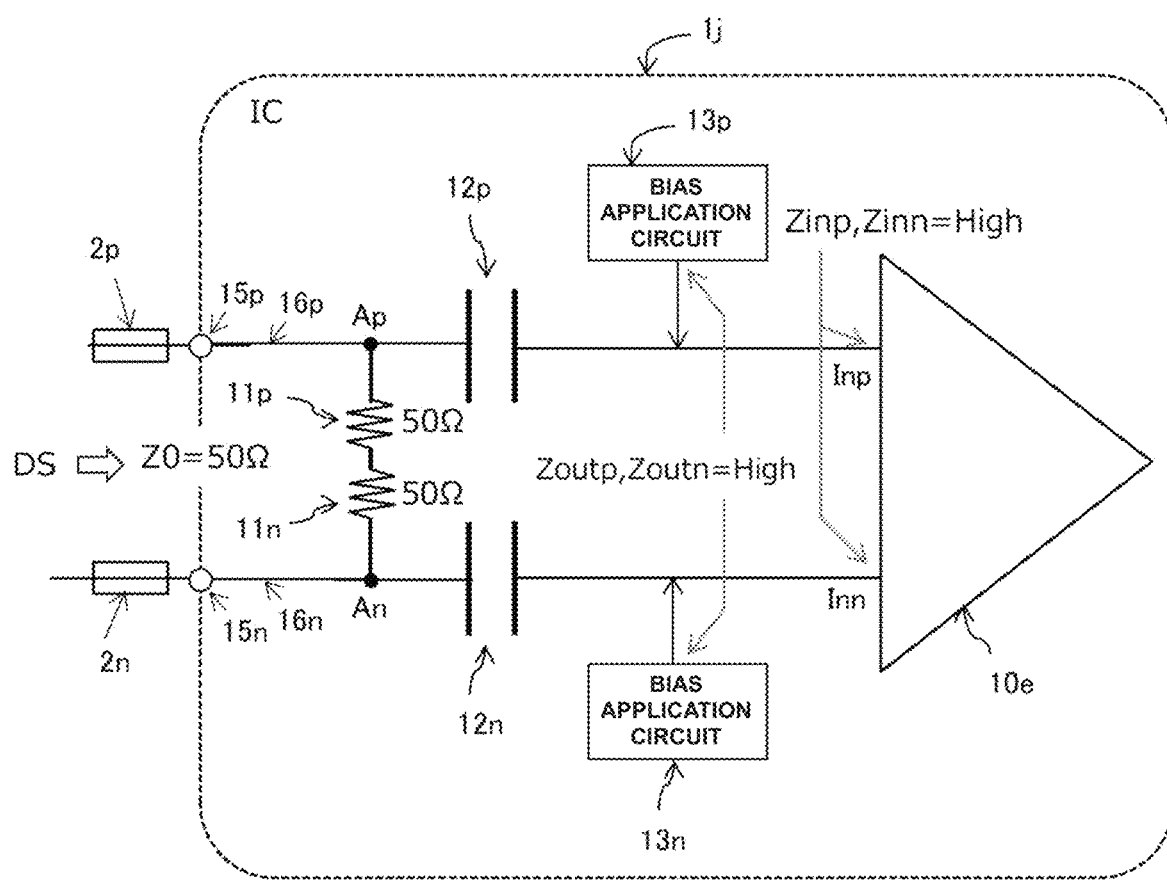
FIG. 10 is a circuit diagram showing another arrangement of the reception-side IC chip according to the seventh embodiment of the present invention.

As described in the fifth embodiment, a T-shaped terminal arrangement, as shown in FIG. 9, may be used as a measure against common mode noise or a π-shaped terminal arrangement as that of a reception-side IC chip 1j shown in FIG. 10 may be used.

Eighth Embodiment

Figure 11:
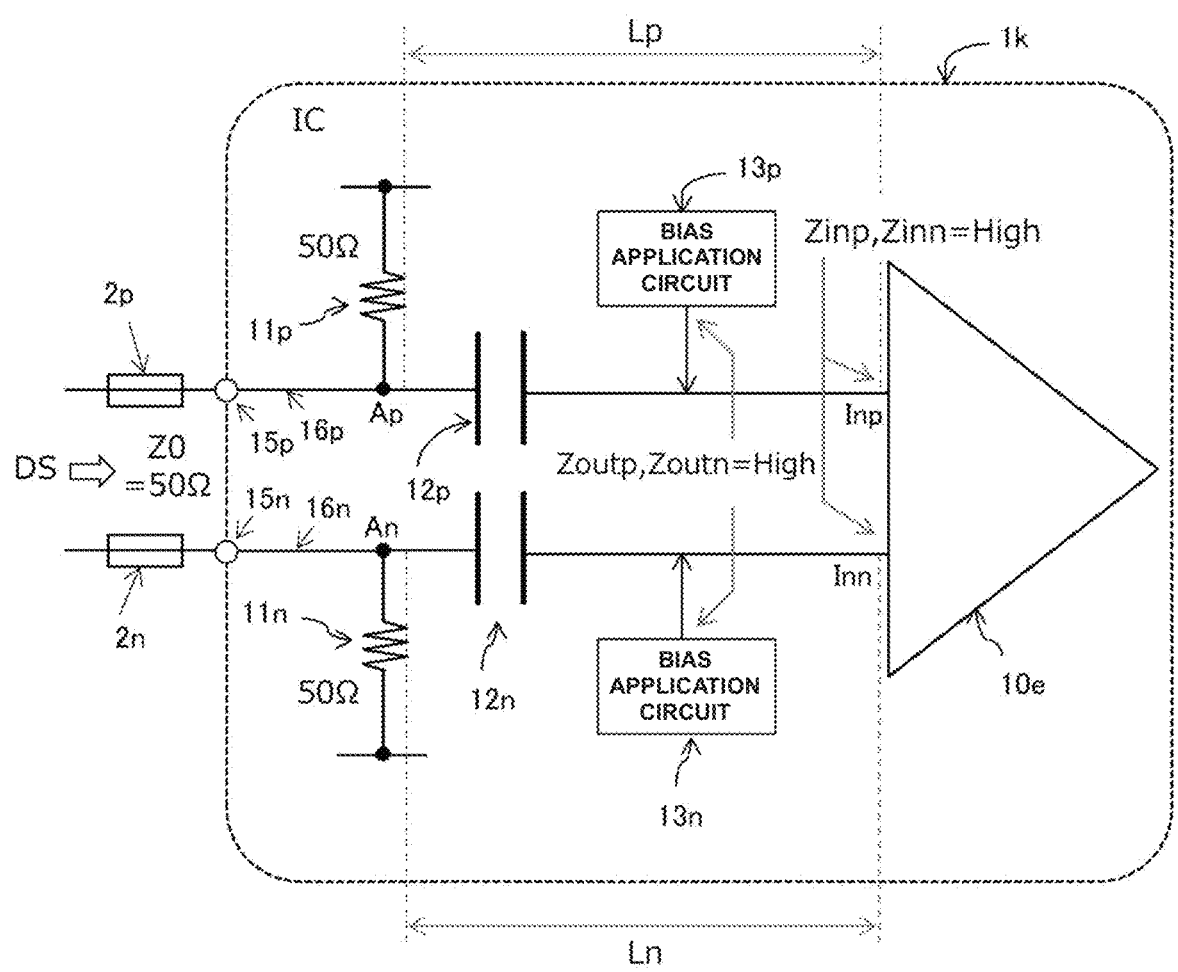
FIG. 11 is a circuit diagram showing the arrangement of a reception-side IC chip according to the eighth embodiment of the present invention.

The eighth embodiment of the present invention will be described next. FIG. 11 is a circuit diagram showing the arrangement of a reception-side IC chip according to the eighth embodiment of the present invention. A reception-side IC chip 1k according to the embodiment has the same arrangement as the seventh embodiment, but is characterized in that a length Lp, from a node Ap of a non-inverting-side signal line 16p and a termination resistor 11p to a non-inverting input terminal Inp of a reception-side input unit circuit 10e, and a length Ln, from a node An of an inverting-side signal line 16n and a termination resistor 11n to an inverting input terminal Inn of the reception-side input unit circuit 10e will be sufficiently shorter than the wavelength of the maximum frequency component of a differential signal DS handled by the reception-side IC chip 1k (reception-side input unit circuit 10e). In the same manner as the sixth embodiment, the lengths Lp and Ln can be set to be less than 1/20 of the wavelength of the maximum frequency component of the signal DS handled by the reception-side IC chip 1k (reception-side input unit circuit 10e).

Figure 12:
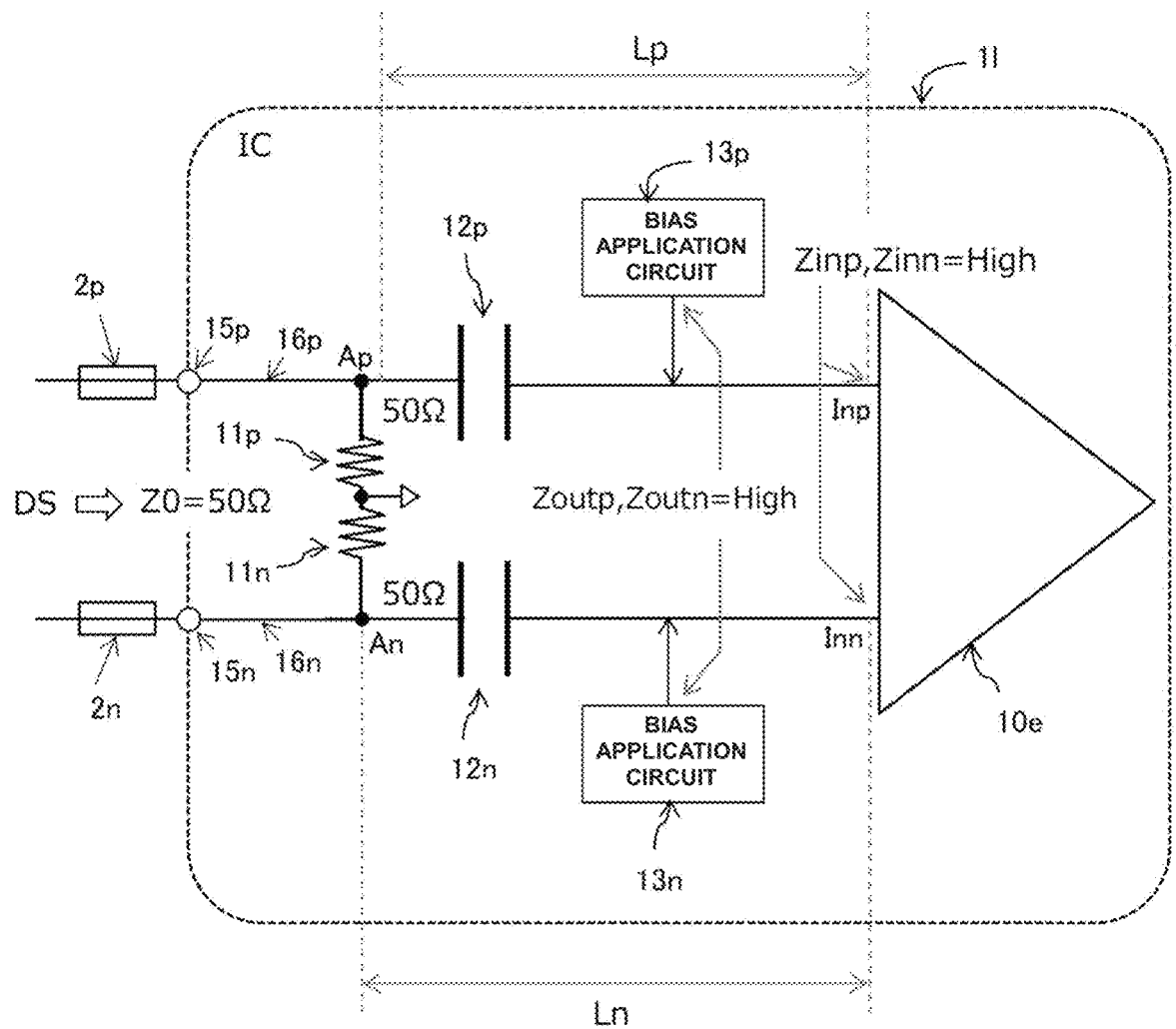
FIG. 12 is a circuit diagram showing another arrangement of the reception-side IC chip according to the eighth embodiment of the present invention.

As described in the fifth embodiment, a T-shaped termination, as shown in FIG. 11, may be arranged as a measure against common mode noise or a π-shaped termination as that of a reception-side IC chip 11 shown in FIG. 12 may be arranged.

As described above, by using an IC chip that has the characteristics described in the fifth to eighth embodiments, the same effects as those of the first to fourth embodiments can be obtained in a differential circuit. In the case of the fifth and sixth embodiments, a high-pass filter is formed by a capacitor 12p and a non-inverting-side input impedance Zinp of the reception-side input unit circuit 10e. The input impedance Zinp (the value of a resistor R) can be set based on equation (1) so that the cutoff frequency of the high-pass filter and the capacitance of the capacitor 12p become desired values, respectively. In the same manner, since a high-pass filter is formed by a capacitor 12n and an inverting-side input impedance Zinn of the reception-side input unit circuit 10e, the input impedance Zinn (the value of the resistor R) can be set so that the cutoff frequency of the high-pass filter and the capacitance of the capacitor 12n become desired values, respectively.

Also, in the case of the seventh and eighth embodiments, a high-pass filter is formed by the capacitor 12p and a combined resistance of the non-inverting-side input impedance Zinp of the reception-side input unit circuit 10e and an output impedance Zoutp of a bias application circuit 13p. The input impedance Zinp and the output impedance Zoutp can be set so that the cutoff frequency of the high-pass filter and the capacitance of the capacitor 12p become desired values, respectively. In the same manner, since a high-pass filter is formed by the capacitor 12n and a combined resistance of the inverting-side input impedance Zinn of the reception-side input unit circuit 10e and an output impedance Zoutn of a bias application circuit 13n, the input impedance Zinn and the output impedance Zoutn can be set so that the cutoff frequency of the high-pass filter and the capacitance of the capacitor 12n become desired values, respectively.

Ninth Embodiment

An example of the arrangement of a reception-side input unit circuit 10 according to each of the first to fourth embodiments will be described next. As described above, the reception-side input unit circuit 10 that has a high input impedance needs to be arranged to implement the IC chip according to each of the first to fourth embodiments. As the circuit arrangement, a circuit which uses the base as an input is suitable in a case in which a bipolar transistor is to be used, and a circuit which uses the gate as an input is suitable in a case in which an FET (field effect transistor) is to be used.

Figure 13A:
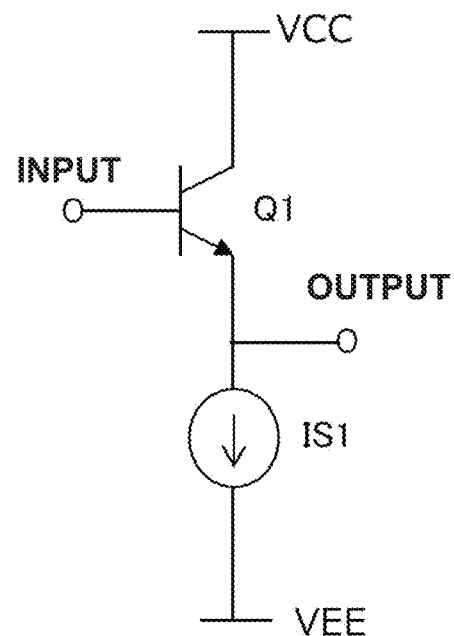
FIGS. 13A and 13B are circuit diagrams showing examples of the arrangement of an input stage of a reception-side input unit circuit according to the first to fourth embodiments of the present invention.
Figure 13B:
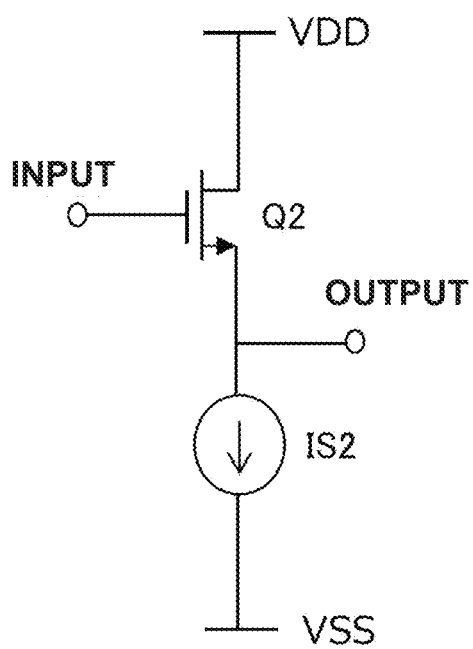

That is, in the case of a bipolar transistor, it is preferable to use an emitter follower formed by a bipolar transistor Q1 and a current source IS1, as shown in FIG. 13A, as the arrangement of an input stage of the reception-side input unit circuit 10. Also, in the case of an FET, it is preferable to use a source follower formed by an FET Q2 and a current source IS2, as shown in FIG. 13B, as the arrangement of the input stage of the reception-side input unit circuit 10.

10th Embodiment

An example of the arrangement of a reception-side input unit circuit 10e according to each of the fifth to eighth embodiments will be described next. In the same manner as the first to fourth embodiments, the reception-side input unit circuit 10e that has a high input impedance needs to be arranged to implement the IC chip according to each of the fifth to eighth embodiments.

Figure 14A:
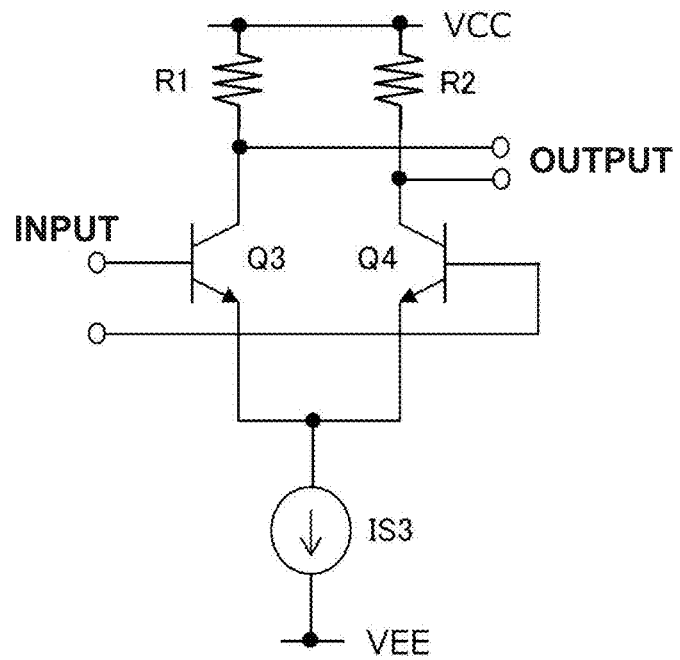
FIGS. 14A and 14B are circuit diagrams showing examples of the arrangement of an input stage of a reception-side input unit circuit according to the fifth to eighth embodiments of the present invention.
Figure 14B:
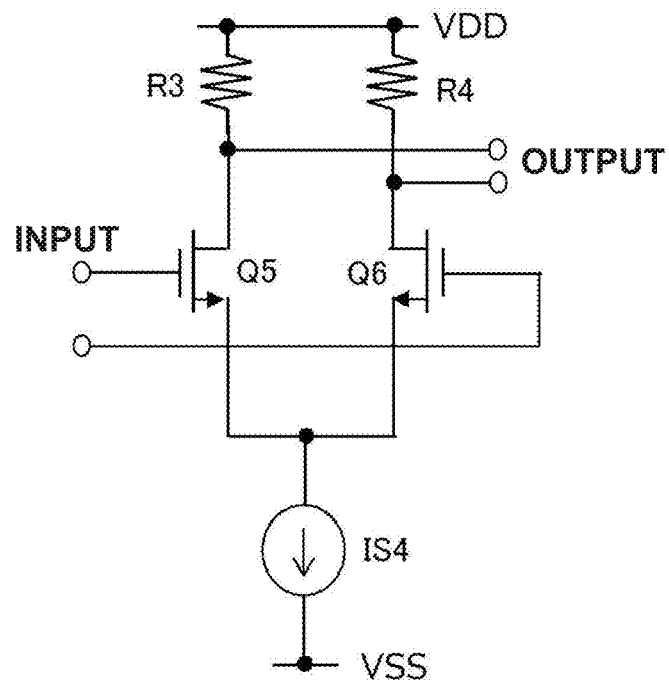

In the case of a bipolar transistor, it is preferable to use, as the arrangement of an input stage of the reception-side input unit circuit 10e, a differential circuit formed by bipolar transistors Q3 and Q4, resistors R1 and R2, and a current source IS3 as shown in FIG. 14A. Also, in the case of an FET, it is preferable to use, as the arrangement of the input stage of the reception-side input unit circuit 10e, a differential circuit formed by FETs Q5 and Q6, resistors R3 and R4, and a current source IS4 as shown in FIG. 14B.

11th Embodiment

Figure 15:
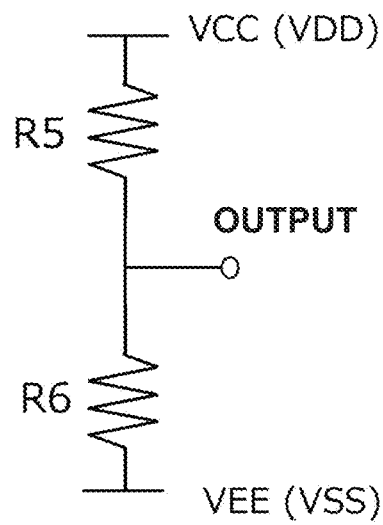
FIG. 15 is a circuit diagram showing an example of the arrangement of a bias application circuit according to the third, fourth, seventh, and eighth embodiment of the present invention.

An example of the arrangement of bias application circuits 13, 13p, and 13n according to the third, fourth, seventh, and eighth embodiments will be described next. The bias application circuit 13 according to the third and fourth embodiments can be implemented by a voltage divider circuit that is formed, for example, as shown in FIG. 15, by a resistor R5 in which one terminal is connected to a positive power supply voltage VCC (VDD in a case in which a reception-side input unit circuit 10 is formed by an FET) and the other terminal is connected to an output terminal of the bias application circuit 13, and a resistor R6 in which one terminal is connected to the output terminal of the bias application circuit 13 and the other terminal is connected to a negative power supply voltage VEE (VSS in the case in which the reception-side input unit circuit 10 is formed by an FET).

The bias application circuits 13p and 13n according to the seventh and eighth embodiments can also be implemented in the same manner by a voltage divider circuit.

As described above, to make capacitors 12, 12p, and 12n be of a size that can be mounted on a chip, the resistance values of the resistors R5 and R6 need to be increased to increase output impedances Zout, Zoutp, and Zoutn of the bias application circuits 13, 13p, and 13n, respectively. More specifically, the values of the resistors R5 and R6 can be set in accordance with the respective bias voltages output from the bias application circuit 13, 13p, and 13n and the respective required output impedances Zout, Zoutp, and Zoutn.

12th Embodiment

Figure 16:
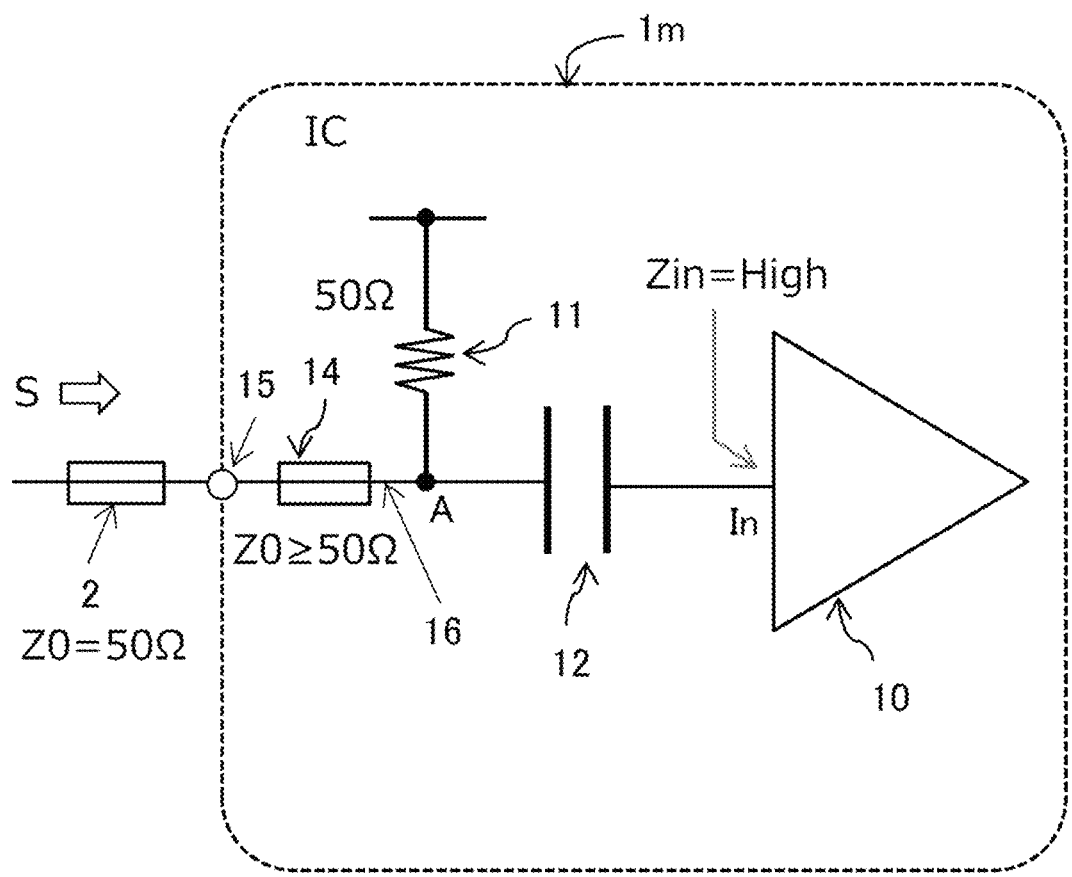
FIG. 16 is a circuit diagram showing the arrangement of a reception-side IC chip according to the 12th embodiment of the present invention.

The 12th embodiment of the present invention will be described next. FIG. 16 is a circuit diagram showing the arrangement of a reception-side IC chip according to the 12th embodiment of the present invention. A reception-side IC chip 1m according to this embodiment is characterized in that a transmission line 14 having a characteristic impedance Z0 of 50Ω or more has been inserted in series to a signal line 16 of the arrangement according to the first embodiment or the second embodiment.

In this embodiment, the insertion of the transmission line 14 can suppress, in an input unit of the reception-side IC chip 1m, the influence of a parasitic capacitance from an input port (a signal input pad connected to a transmission line 2 or the like) to a termination resistor 11.

Figure 17:
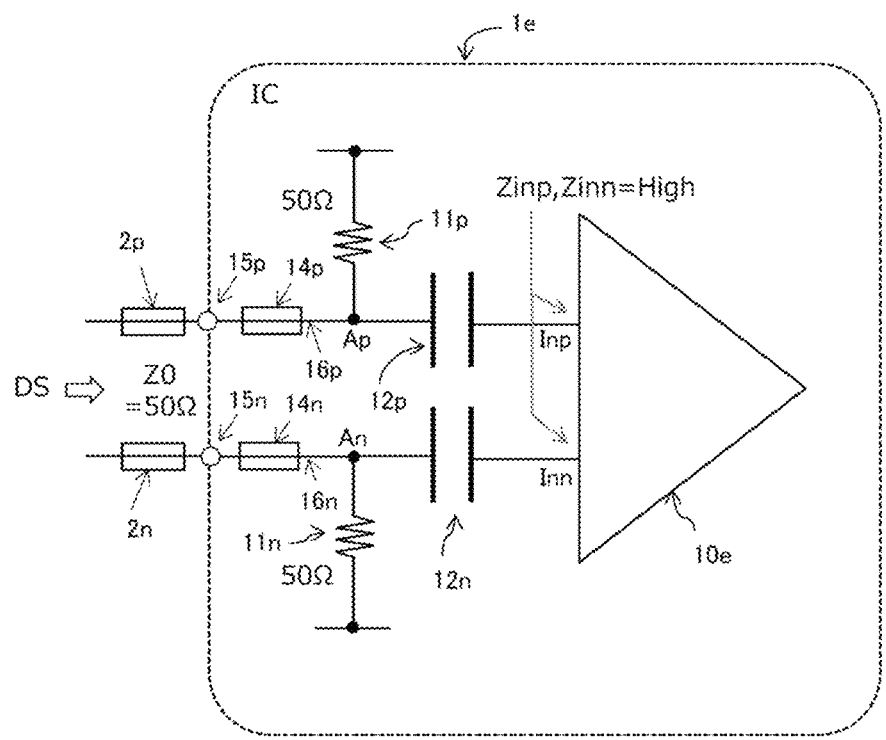
FIG. 17 is a circuit diagram showing another arrangement of the reception-side IC chip according to the 12th embodiment of the present invention.

The transmission line 14 can be applied to any of the first to eighth embodiments. If it is to be applied to the fifth to eighth embodiments, transmission lines 14p and 14n each having the characteristic impedance Z0 of 50Ω or more can be inserted to signal lines 16p and 16n, respectively, as shown in FIG. 17. Although the arrangement of FIG. 17 shows a case in which the transmission lines 14p and 14n are applied to FIG. 5, they can also be applied to each of FIGS. 6 to 12 in the same manner.

Finally, the effects of the present invention will be described hereinafter. To confirm the effects of the present invention, a case in which a capacitor of 2.5 pF having a size that can be mounted on a chip is used in a conventional arrangement and a case in which the capacitor is used in the arrangement of the present invention are compared by a circuit simulator by using an example of a wideband amplifier.

Figure 18:
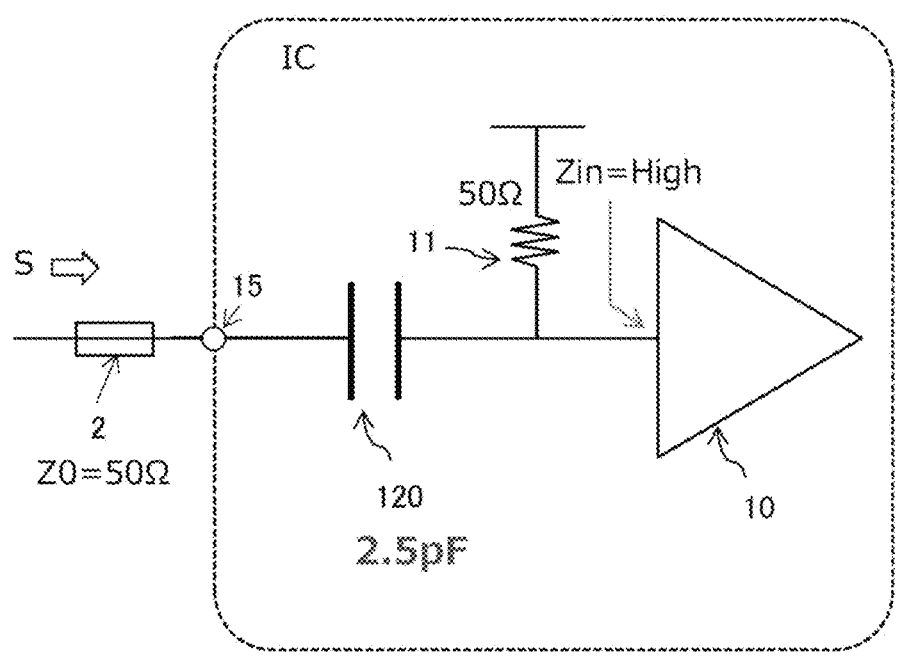
FIG. 18 is a circuit diagram showing the arrangement of a conventional reception-side IC chip targeting evaluation by simulation.

As shown in FIG. 18, the conventional arrangement uses an arrangement in which a capacitor 120 of 2.5 pF is inserted between the terminal of the transmission line 2 and a node of the termination resistor 11 and an input terminal of a reception-side input unit circuit 10.

On the other hand, the arrangement of the present invention uses an arrangement in which the capacitance of a capacitor 12 in a reception-side IC chip 1d according to the fourth embodiment shown in FIG. 4 is 2.5 pF.

Figure 19:
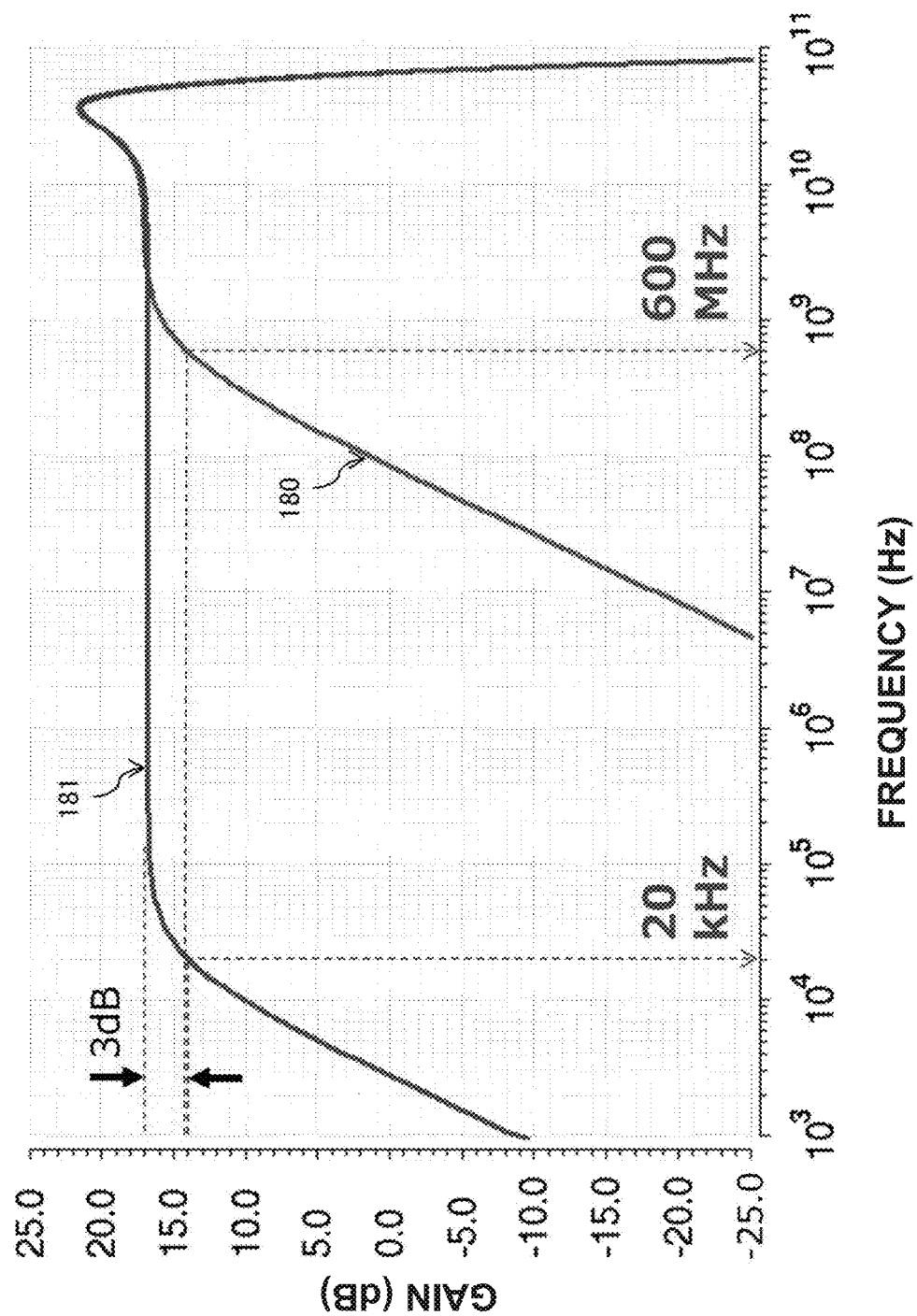
FIG. 19 is a graph showing a frequency characteristic simulation results of the conventional reception-side IC chip and the reception-side IC chip of the present invention.

FIG. 19 is a graph showing a frequency characteristic simulation results of the conventional reception-side IC chip and the reception-side IC chip of the present invention. In FIG. 19, reference numeral 180 indicates the frequency characteristic of the conventional reception-side IC chip, and reference numeral 181 indicates the frequency characteristic of the reception-side IC chip of the present invention.

It can be seen in FIG. 19 that using the arrangement of the present invention allows the cutoff frequency of a low frequency range to be extended from 600 MHz to 20 kHz without degrading high frequency characteristics. As described above, the present invention can be used to implement a compact wideband DC-blocking circuit that can be mounted on an IC chip.

13th Embodiment

Figure 20:
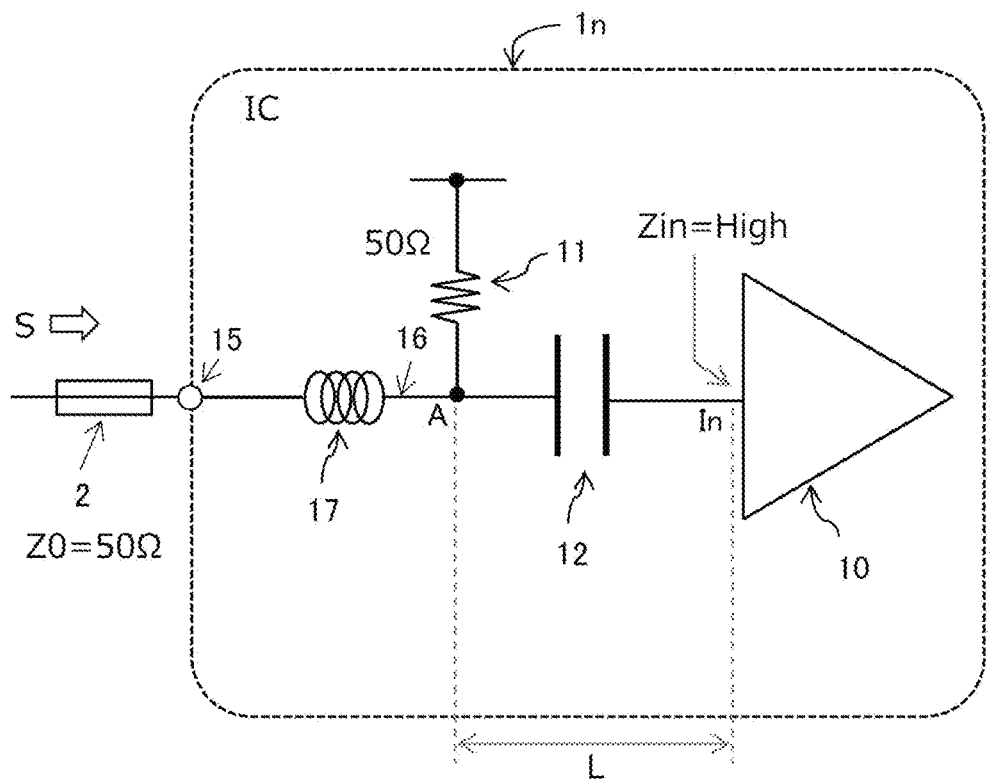
FIG. 20 is a circuit diagram showing the arrangement of a reception-side IC chip according to the 13th embodiment of the present invention.

The 13th embodiment of the present invention will be described next. FIG. 20 is a circuit diagram showing the arrangement of a reception-side IC chip according to the 13th embodiment of the present invention. A reception-side IC chip 1n according to this embodiment is characterized in that an inductor 17 is inserted in series to a signal line 16 in the arrangement of the first embodiment or the second embodiment.

In the first to 12th embodiments, degradation of the reflection characteristics/impedance matching on the high-frequency side occurs because a parasitic capacitance due to circuit layout is added to nodes A, Ap, and An of termination resistors 11, 11p, and 11n and capacitors 12, 12p, and 12n, respectively. The inductor 17 can be inserted as shown in FIG. 20 to suppress the degradation of the reflection characteristic. In this case, since the inductor 17 has an inductance value of a small pH order, it can be regarded to be short-circuited in the low frequency range. Hence, the inductor 17 will not greatly influence the cutoff frequency of the low frequency range that needs to be ensured in the present invention.

Figure 21:
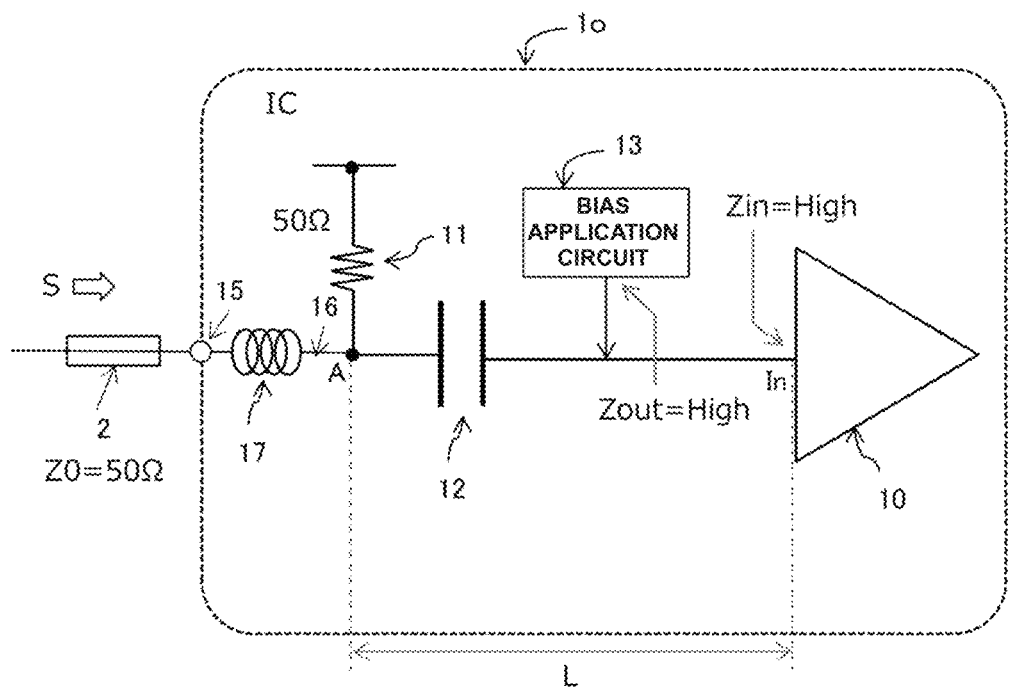
FIG. 21 is a circuit diagram showing another arrangement of the reception-side IC chip according to the 13th embodiment of the present invention.

FIG. 21 shows the arrangement of a reception-side IC chip 10 obtained in a case in which the inductor 17 is applied to FIG. 3 according to the third embodiment or FIG. 4 according to the fourth embodiment.

Figure 22:
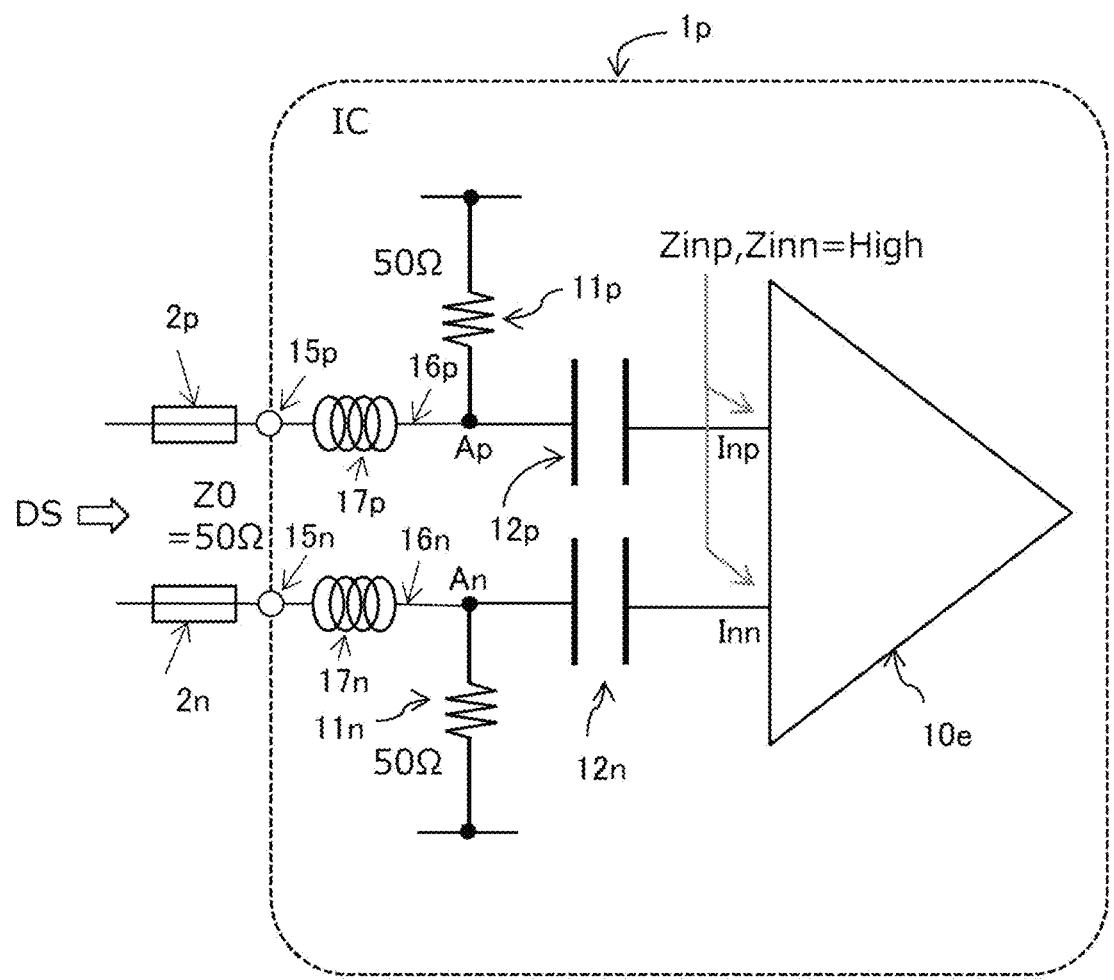
FIG. 22 is a circuit diagram showing yet another arrangement of the reception-side IC chip according to the 13th embodiment of the present invention.

FIG. 22 shows the arrangement of a reception-side IC chip 1p obtained in a case in which inductors 17p and 17n are inserted in series to signal lines 16p and 16n, respectively, shown in FIG. 5 according to the fifth embodiment. Although the arrangement of FIG. 22 shows a case in which the inductors 17p and 17n are applied to FIG. 5, the arrangement can be applied in the same manner to each of FIGS. 6 to 8.

Figure 23:
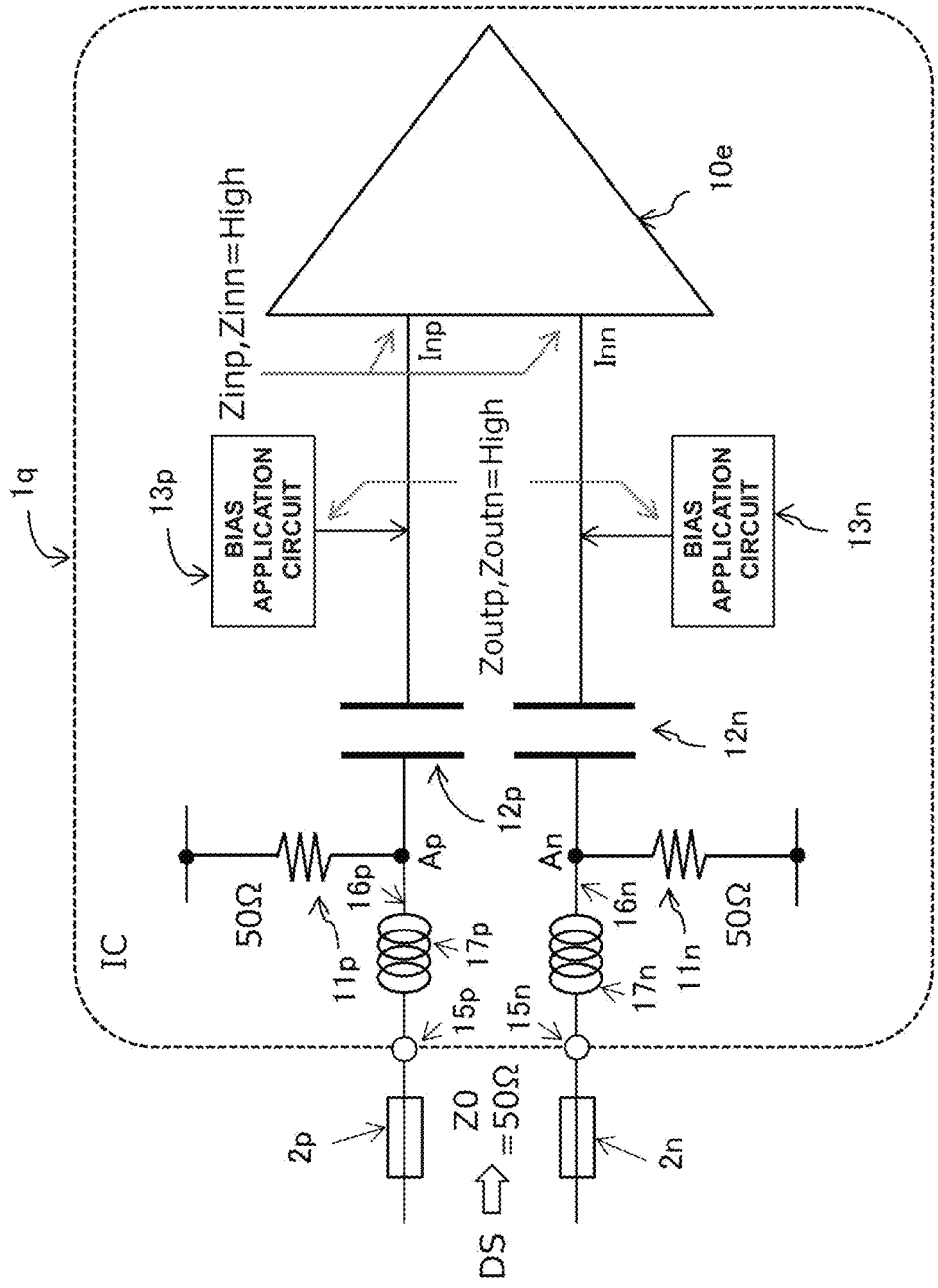
FIG. 23 is a circuit diagram showing still yet another arrangement of the reception-side IC chip according to the 13th embodiment of the present invention.

FIG. 23 shows the arrangement of a reception-side IC chip 1q obtained in a case in which the inductors 17p and 17n are inserted in series to the signal lines 16p and 16n, respectively, shown in FIG. 9 according to the seventh embodiment. Although the arrangement of FIG. 23 shows a case in which the inductors 17p and 17n are applied to FIG. 9, the arrangement can be applied in the same manner to each of FIGS. 10 to 12.

14th Embodiment

Figure 24:
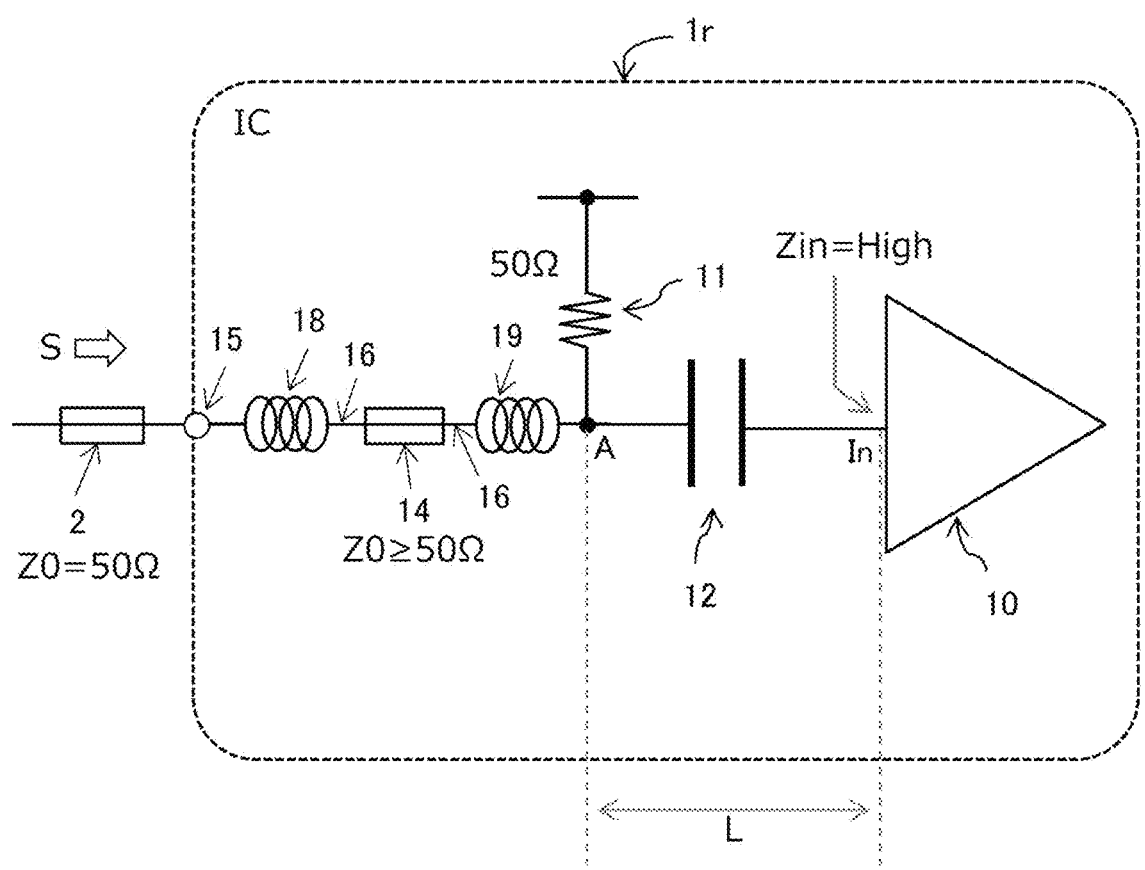
FIG. 24 is a circuit diagram showing the arrangement of a reception-side IC chip according to the 14th embodiment of the present invention.

The 14th embodiment of the present invention will be described next. FIG. 24 is a circuit diagram showing the arrangement of a reception-side IC chip according to the 14th embodiment of the present invention. A reception-side IC chip 1r according to this embodiment is characterized in that an inductor 18 is inserted in series to a signal line 16 between a pad 15 and a transmission line 14 and an inductor 19 is inserted in series to the signal line 16 between the transmission line 14 and a node A of the signal line 16 and a termination resistor 11 in the arrangement according to the 12th embodiment.

As a result, the degradation of the reflection characteristic in the high-frequency range due to parasitic capacitance of the pad 15 can be suppressed in this embodiment.

Figure 25:
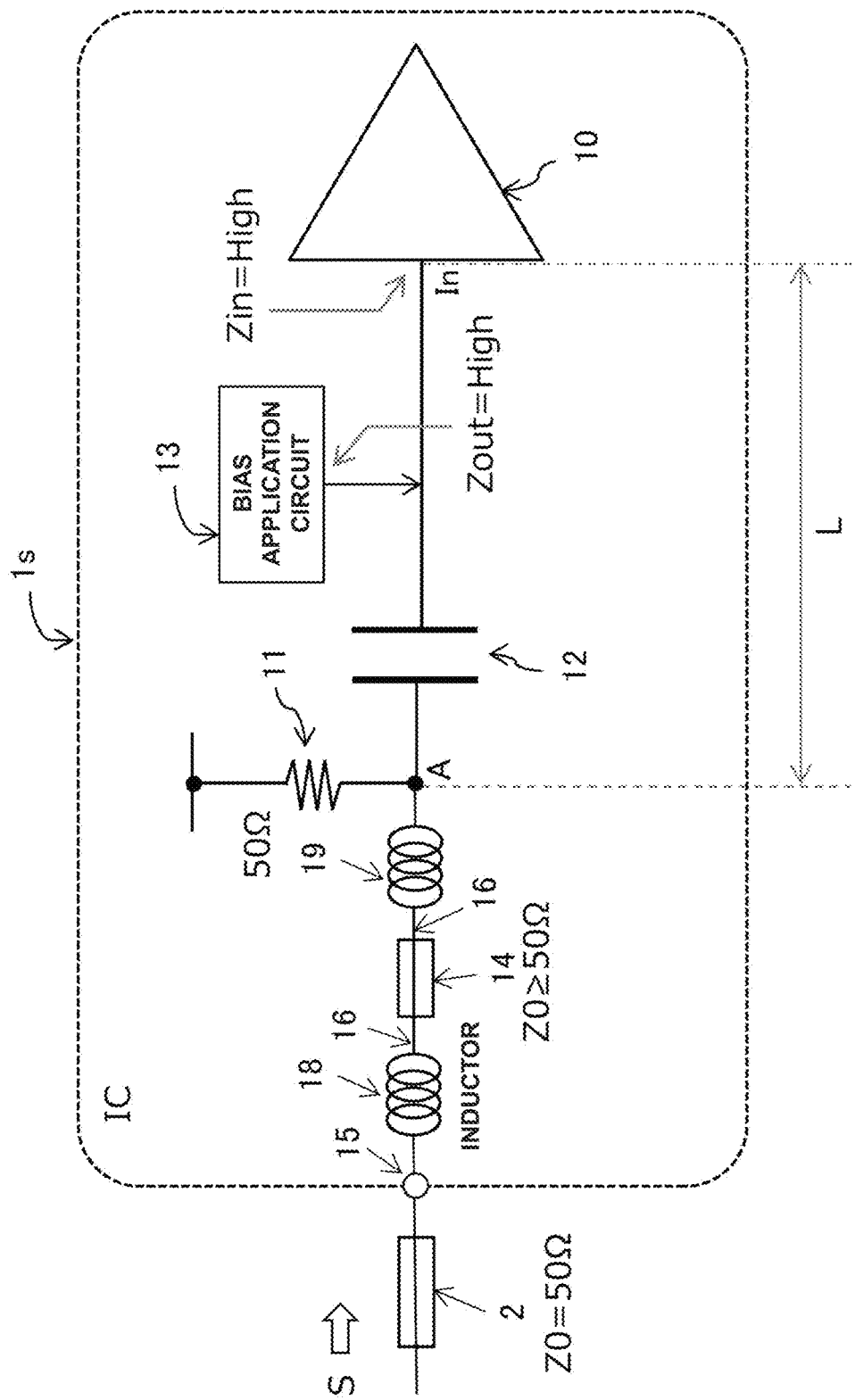
FIG. 25 is a circuit diagram showing another arrangement of the reception-side IC chip according to the 14th embodiment of the present invention.

FIG. 25 shows the arrangement of a reception-side IC chip 1s obtained in a case in which the inductors 18 and 19 are applied to FIG. 3 according to the third embodiment or FIG. 4 according to the fourth embodiment.

Figure 26:
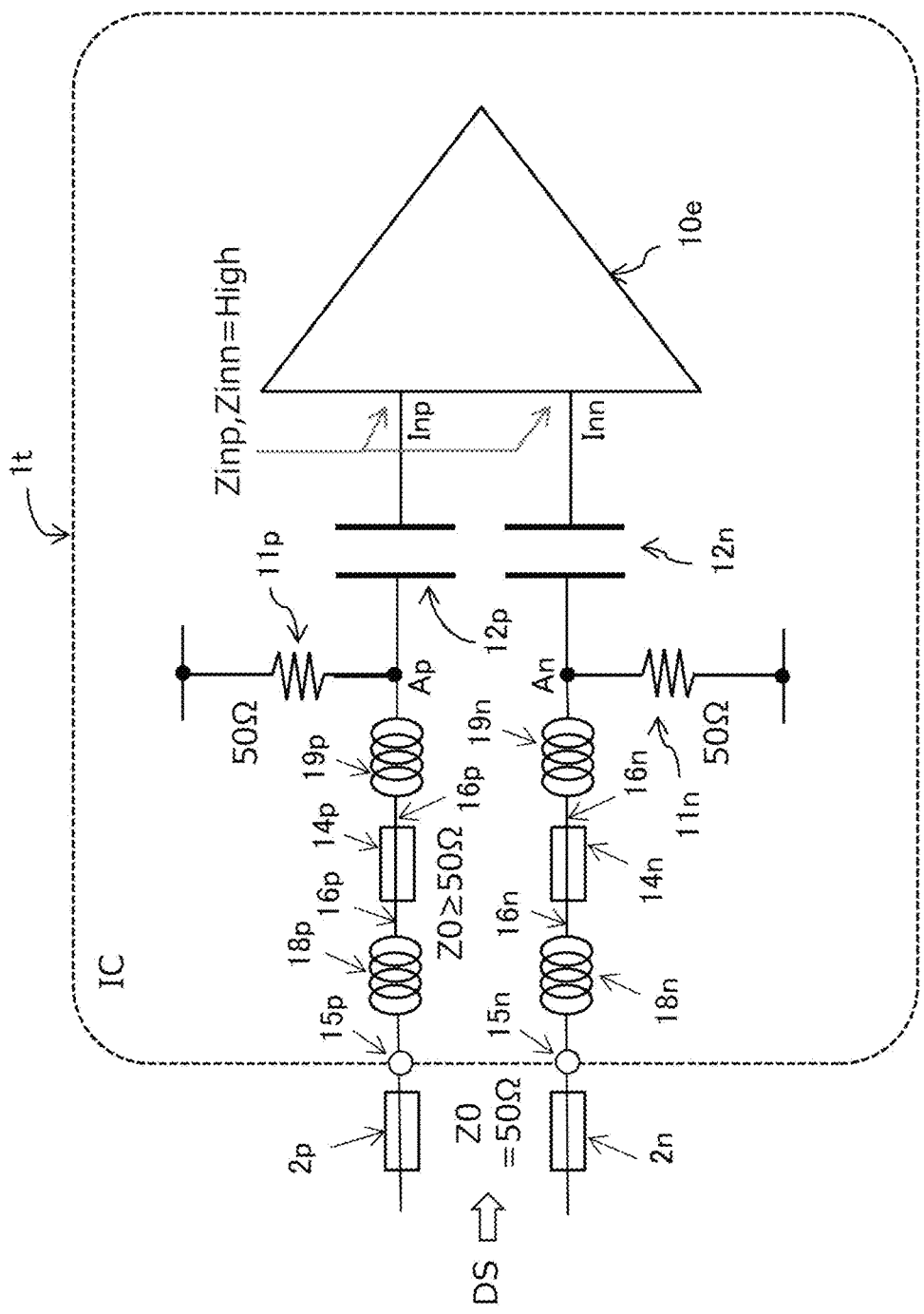
FIG. 26 is a circuit diagram showing yet another arrangement of the reception-side IC chip according to the 14th embodiment of the present invention.

FIG. 26 shows the arrangement of a reception-side IC chip it obtained in a case in which inductors 18p and 19p and inductors 18n and 19n are inserted in series to signal lines 16p and 16n, respectively, shown in FIG. 17 according to the 12th embodiment. Although the arrangement of FIG. 26 shows a case in which the inductors 18p, 19p, 18n, and 19n are applied to FIG. 17, the arrangement can be applied in the same manner to an arrangement obtained by serially inserting transmission lines 14p and 14n to the signal lines 16p and 16n, respectively, of each of FIGS. 6 to 8.

Figure 27:
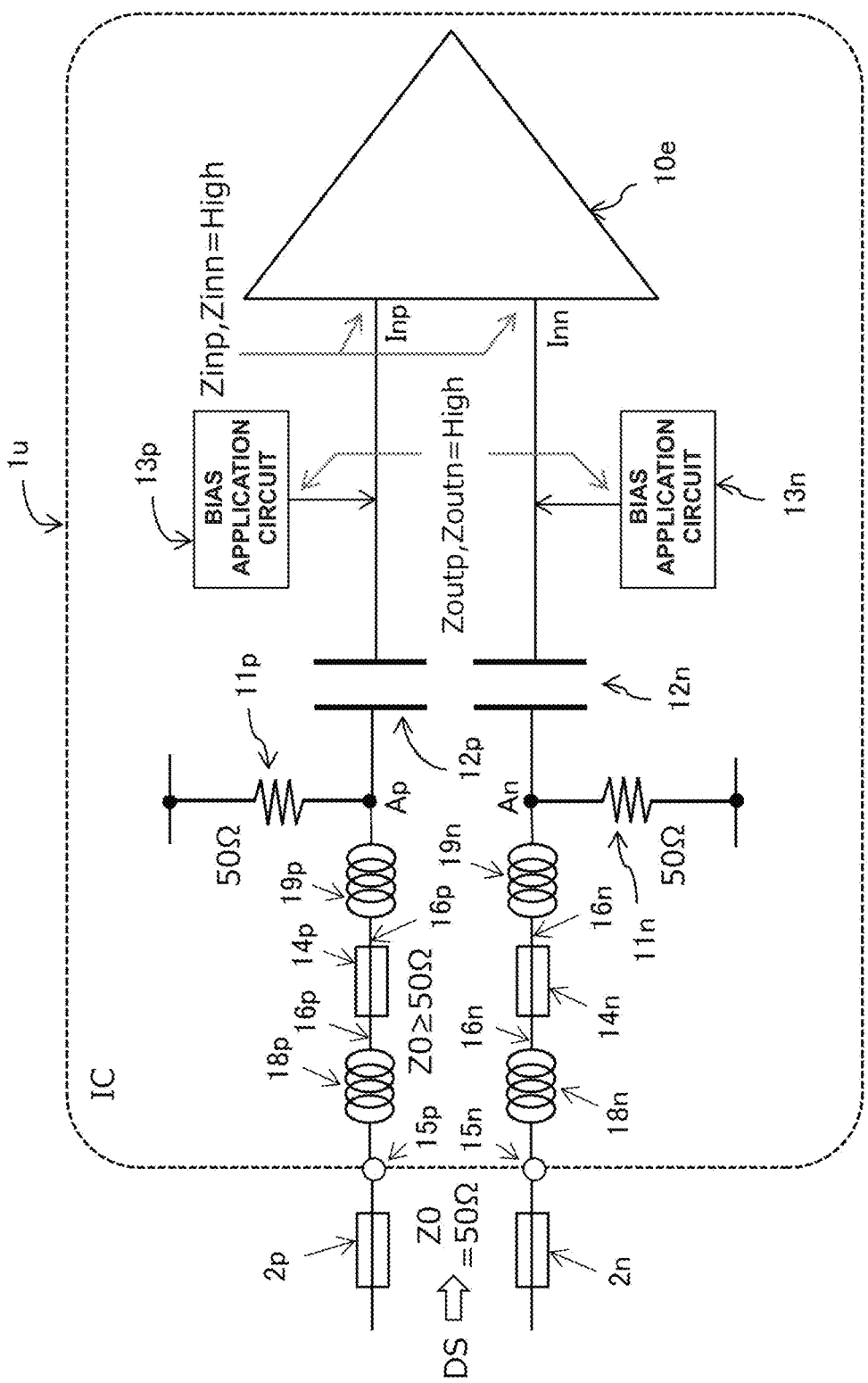
FIG. 27 is a circuit diagram showing still yet another arrangement of the reception-side IC chip according to the 14th embodiment of the present invention.

FIG. 27 shows the arrangement of a reception-side IC chip 1u obtained in a case in which the transmission lines 14p and 14n are inserted in series to the signal lines 16p and 16n, respectively, and the inductors 18p and 19p and inductors 18n and 19n are inserted in series to the signal lines 16p and 16n, respectively, shown in FIG. 9 according to the seventh embodiment. Although the arrangement of FIG. 27 shows a case in which the inductors 18p, 19p, 18n, and 19n are applied to FIG. 9, the arrangement can be applied in the same manner to an arrangement obtained by serially inserting the transmission lines 14p and 14n to the signal lines 16p and 16n, respectively, of each of FIGS. 10 to 12.

15th Embodiment

Figure 28:
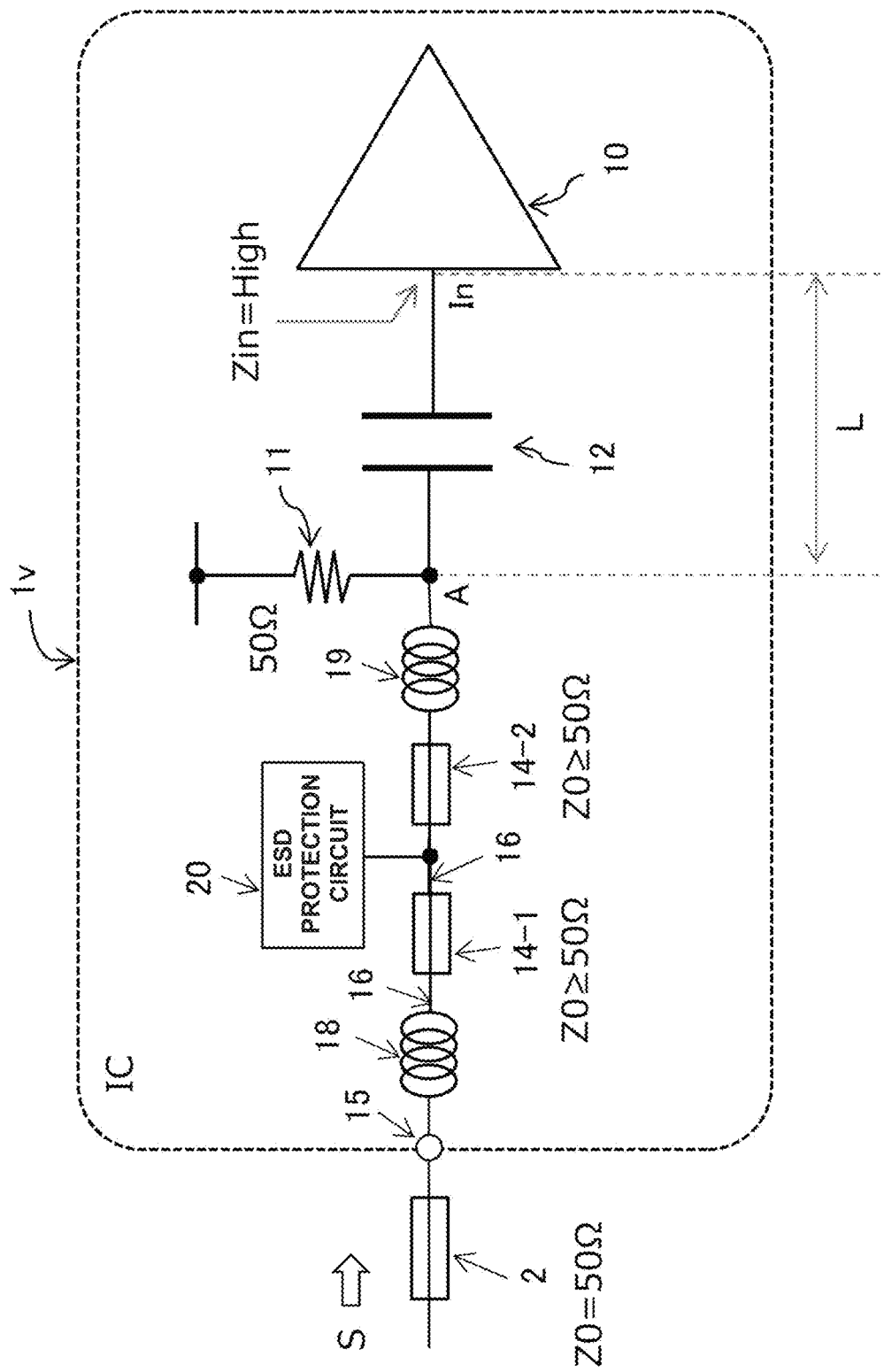
FIG. 28 is a circuit diagram showing the arrangement of a reception-side IC chip according to the 15th embodiment of the present invention.

The 15th embodiment of the present invention will be described next. FIG. 28 is a circuit diagram showing the arrangement of a reception-side IC chip according to the 15th embodiment of the present invention. A reception-side IC chip 1v according to this embodiment is characterized in that a transmission line 14 is formed by two transmission lines 14-1 and 14-2, which are connected in series, and an ESD (ElectroStatic Discharge) protection circuit 20, which is connected to a signal line 16 between the two transmission lines 14-1 and 14-2, are included in the arrangement according to the 14th embodiment shown in FIG. 24.

For example, when the IC is to be handled at the time of an implementation process, there is a possibility that the resistor, the capacitor, or the transistor of a reception-side input unit circuit will be damaged due to ESD. The ESD protection circuit 20 is arranged in the IC chip to improve ESD resistance. However, to suppress the influence (such as the reflection characteristic degradation or the like) of parasitic capacitance due to the addition of the ESD protection circuit 20, the two transmission lines 14-1 and 14-2 having a characteristic impedance Z0 of 50Ω or more are arranged, and the ESD protection circuit 20 is arranged at the node of these two transmission lines 14-1 and 14-2.

Figure 29:
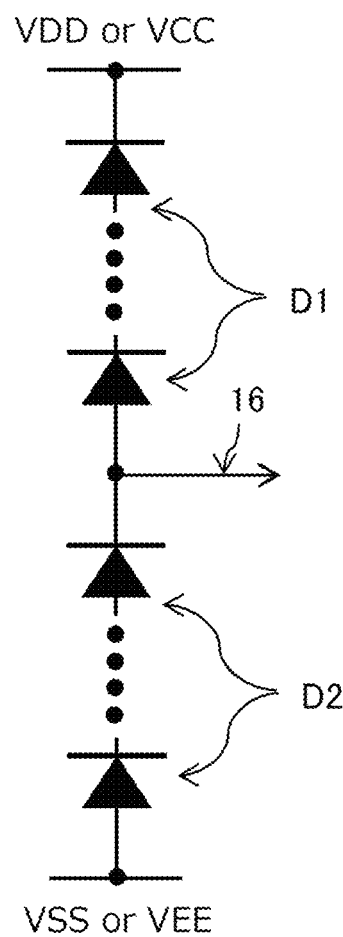
FIG. 29 is a circuit diagram showing the arrangement of an electrostatic discharge protection circuit of the reception-side IC chip according to the 15th embodiment of the present invention.

FIG. 29 shows the arrangement of the ESD protection circuit 20. The ESD protection circuit 20 is formed by N diodes D1, which are connected to set a reverse bias state between a positive power supply voltage VCC (VDD in a case in which a reception-side input unit circuit 10 is formed by an FET) and the signal line 16, and M diodes D2, which are connected to set a reverse bias state between a negative power supply voltage VEE (VSS in a case in which the reception-side input unit circuit 10 is formed by an FET) and the signal line 16.

The stage counts N and M of the diodes D1 and D2, respectively, are parameters that are set arbitrarily to fall within a range in which the diodes D1 and D2 will not break down in accordance with the voltage (a DC operating point in an operation state) of the signal line 16. That is, N 0 and M 0.

In this manner, this embodiment can implement a compact and wideband DC-blocking circuit with high ESD resistance that can be mounted on an IC chip.

Figure 30:
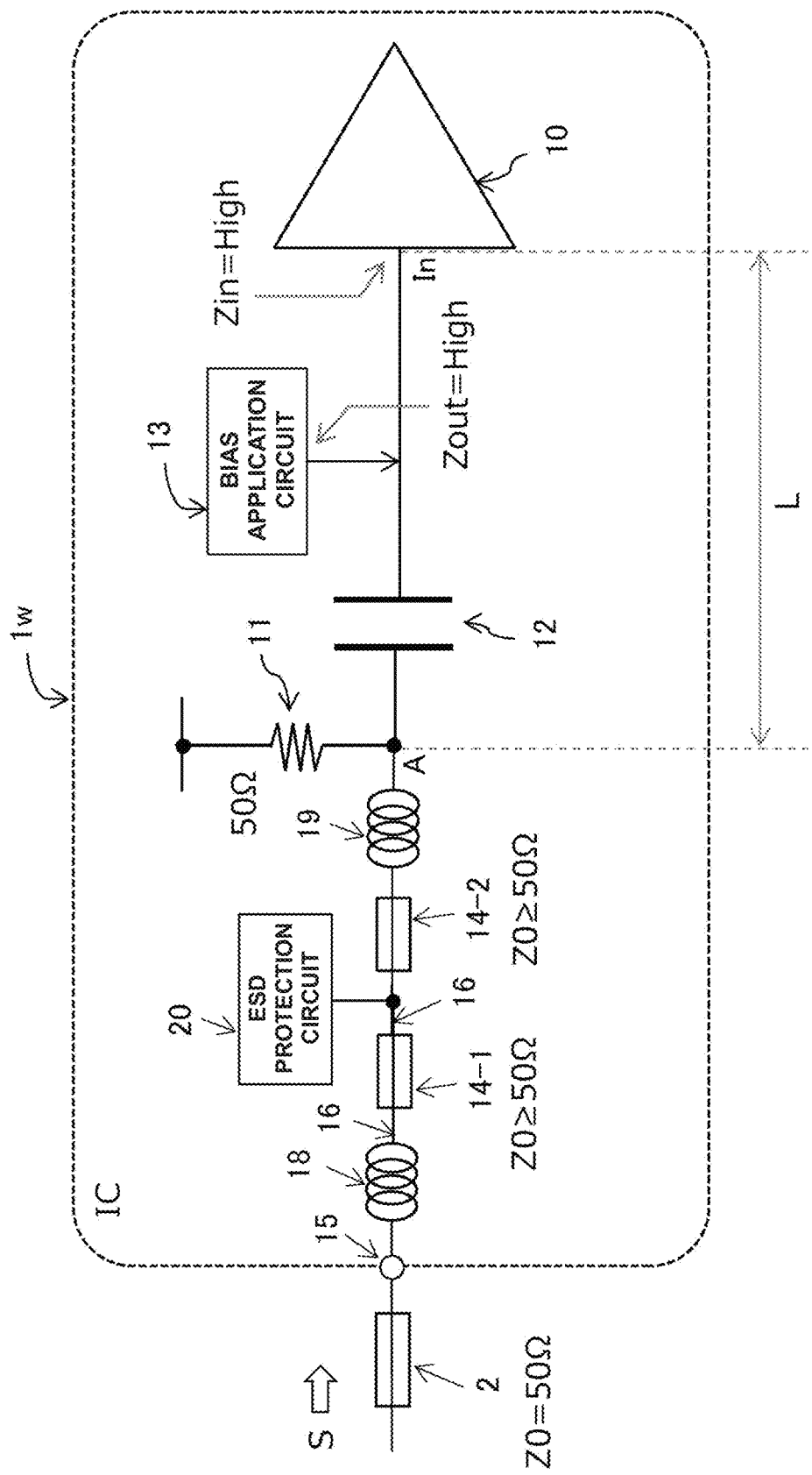
FIG. 30 is a circuit diagram showing another arrangement of the reception-side IC chip according to the 15th embodiment of the present invention.

FIG. 30 shows the arrangement of a reception-side IC chip 1w obtained in a case in which the transmission line 14 is formed by the two transmission lines 14-1 and 14-2 which are connected in series and an ESD (Electrostatic Discharge) protection circuit 20 is connected to the signal line 16 between the two transmission lines 14-1 and 14-2 in the arrangement shown in FIG. 25 according to the 14th embodiment.

Figure 31:
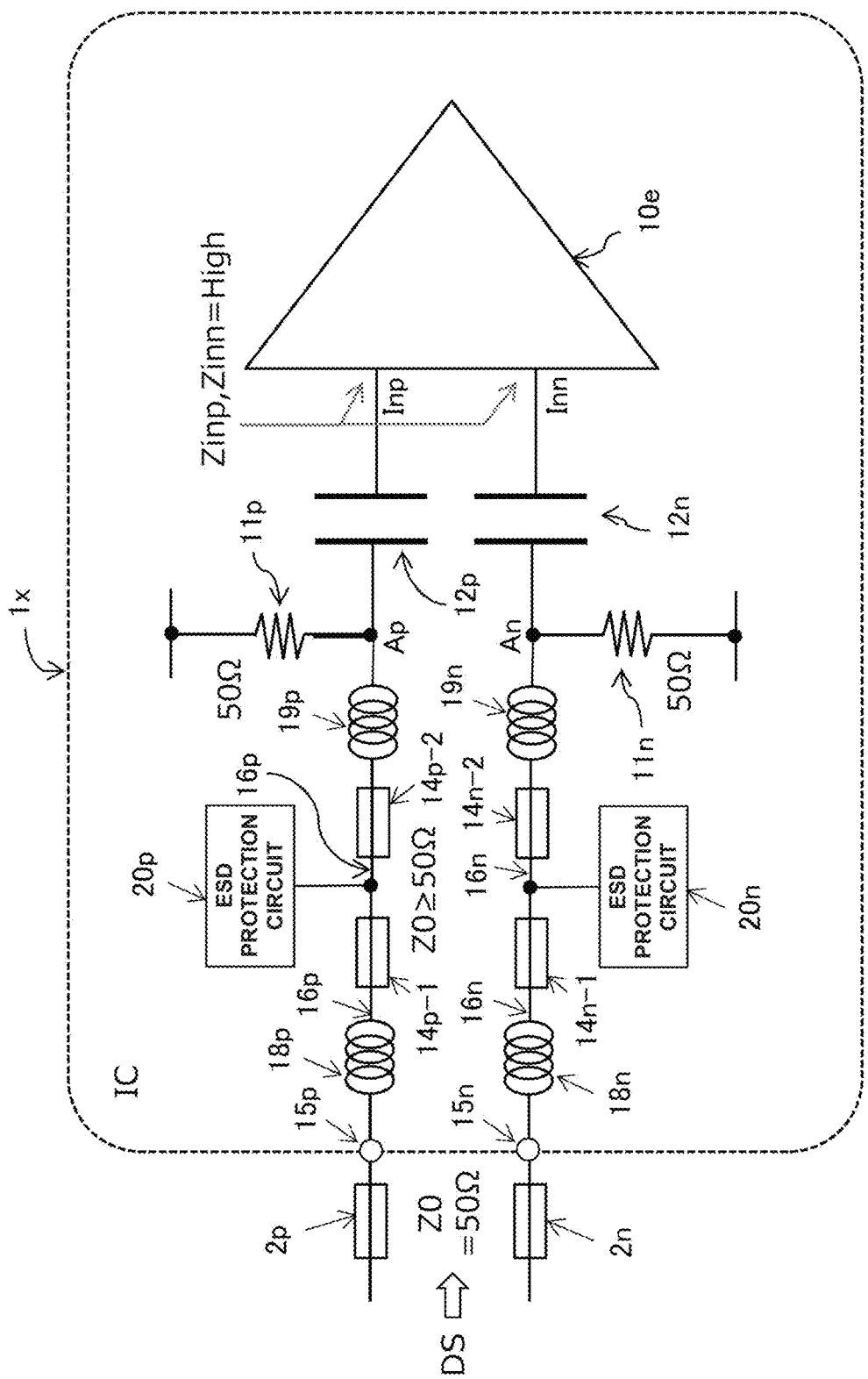
FIG. 31 is a circuit diagram showing yet another arrangement of the reception-side IC chip according to the 15th embodiment of the present invention.

FIG. 31 shows the arrangement of a reception-side IC chip 1x obtained in a case in which a transmission line 14p is formed by two transmission lines 14p-1 and 14p-2 having the characteristic impedance Z0 of 50Ω or more, a transmission line 14n is formed by two transmission lines 14n-1 and 14n-2 having the characteristic impedance Z0 of 50Ω or more, an ESD protection circuit 20p is connected to a signal line 16p between the two transmission lines 14p-1 and 14p-2 which are connected in series, and an ESD protection circuit 20n is connected to a signal line 16n between the two transmission lines 14n-1 and 14n-2 which are connected in series in the arrangement shown in FIG. 26 according to the 14th embodiment. The arrangement of each of the ESD protection circuits 20p and 20n is the same as the ESD protection circuit 20. Although the arrangement of FIG. 31 shows a case in which the ESD protection circuits 20p and 20n are applied to FIG. 26, the arrangement can be applied in the same manner to an arrangement obtained by serially inserting the transmission lines 14p-1 and 14p-2 and inductors 18p and 19p to the signal line 16p and serially inserting the transmission lines 14n-1 and 14n-2 and inductors 18n and 19n to the signal line 16n in each of FIGS. 6 to 8.

Figure 32:
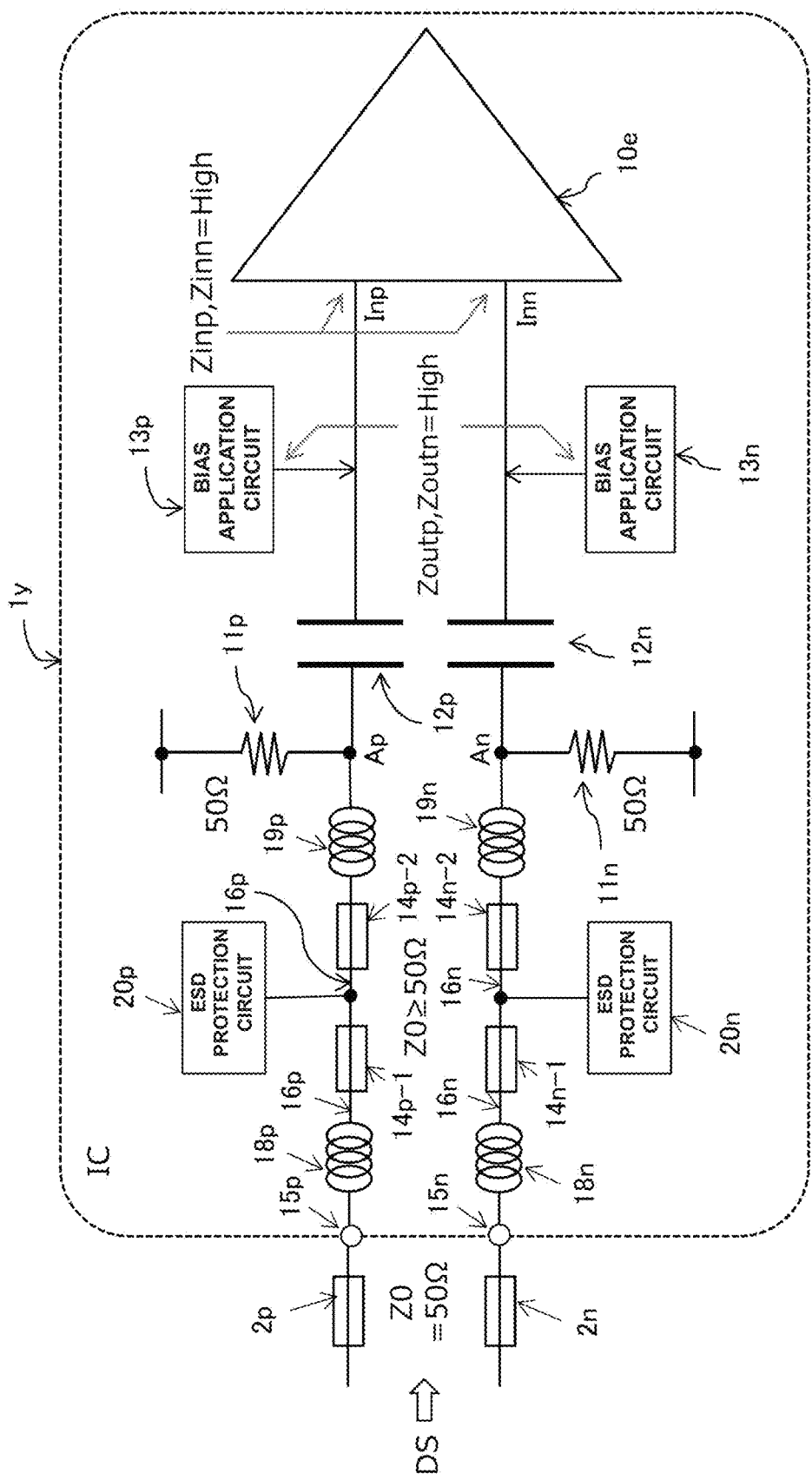
FIG. 32 is a circuit diagram showing still yet another arrangement of the reception-side IC chip according to the 15th embodiment of the present invention.
Figure 33:
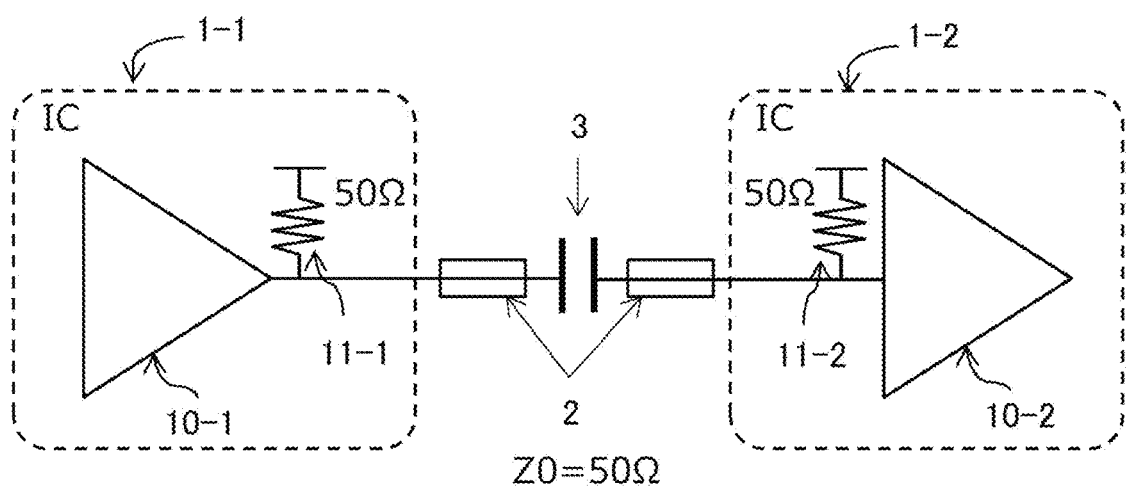
FIG. 33 is a view showing an example of a connection arrangement between ICs via a DC-blocking capacitor which is used in general.

FIG. 32 shows the arrangement of a reception-side IC chip 1y obtained in a case in which the transmission line 14p is formed by the two transmission lines 14p-1 and 14p-2 having the characteristic impedance Z0 of 50Ω or more, the transmission line 14n is formed by two transmission lines 14n-1 and 14n-2 having the characteristic impedance Z0 of 50Ω or more, the ESD protection circuit 20p is connected to the signal line 16p between the two transmission lines 14p-1 and 14p-2 which are connected in series, and the ESD protection circuit 20n is connected to the signal line 16n between the two transmission lines 14n-1 and 14n-2 which are connected in series in the arrangement shown in FIG. 27 according to the 14th embodiment. Although the arrangement of FIG. 32 shows a case in which the ESD protection circuits 20p and 20n are applied to FIG. 27, the arrangement can be applied in the same manner to an arrangement obtained by serially inserting the transmission lines 14p-1 and 14p-2 and the inductors 18p and 19p to the signal line 16p and serially inserting the transmission lines 14n-1 and 14n-2 and the inductors 18n and 19n to the signal line 16n in each of FIGS. 10 to 12.

INDUSTRIAL APPLICABILITY

The present invention can be applied to an IC chip that performs high-speed electrical signal communication.

EXPLANATION OF THE REFERENCE NUMERALS AND SIGNS 1a-1y . . . reception-side IC chip, 2, 2p, 2n, 14, 14-1, 14-2, 14p, 14p-1, 14p-2, 14n, 14n-1, 14n-2 . . . transmission line, 10, 10e . . . reception-side input unit circuit, 11, 11p, 11n . . . termination resistor, 12, 12p, 12n . . . capacitor, 13, 13p, 13n . . . bias application circuit, 15, 15p, 15n . . . pad, 16, 16p, 16n . . . signal line, 17, 17p, 17n, 18, 18p, 18n, 19, 19p, 19n . . . inductor, 20, 20p, 20n . . . ESD protection circuit, Q1, Q3, Q4 . . . bipolar transistor, Q2, Q5, Q6 . . . FET, IS1-IS4 . . . current source, R1-R6 . . . resistor, D1, D2 . . . diode.

The invention claimed is:
1. An IC chip comprising:
a pad connected to a first transmission line outside the chip;
a signal line, one end of which is connected to the pad;
a termination resistor connected to the other end of the signal line, having a same characteristic impedance as a characteristic impedance of the first transmission line and configured to terminate the first transmission line;
a reception-side input unit circuit configured to receive a signal transmitted from a transmission-side via the first transmission line; and
a capacitor inserted between a node of the signal line and the termination resistor and an input terminal of the reception-side input unit circuit.

2. An IC chip comprising:
a pad connected to a first transmission line outside the chip;
a signal line, one end of which is connected to the pad;
a termination resistor connected to the other end of the signal line and configured to terminate the first transmission line,
a reception-side input unit circuit configured to receive a si anal transmitted from a transmission-side via the first transmission line; and
a capacitor inserted between a node of the signal line and the termination resistor and an input terminal of the reception-side input unit circuit,
wherein a length from the node of the signal line and the termination resistor to the input terminal of the reception-side input unit circuit is shorter than a wavelength of a maximum frequency component of a signal handled by the reception-side input unit circuit.

3. The IC chip according to claim 2, wherein the capacitor and an input impedance of the reception-side input unit circuit form a high-pass filter, and
the input impedance of the reception-side input unit circuit is set so that a cutoff frequency of the high-pass filter and a capacitance of the capacitor become desired values, respectively.

4. The IC chip according to claim 2, further comprising:
a bias application circuit configured to apply a DC bias voltage to the input terminal of the reception-side input unit circuit.

5. The IC chip according to claim 4, wherein a high-pass filter is formed by the capacitor and a combined resistance of an input impedance of the reception-side input unit circuit and an output impedance of the bias application circuit, and
the input impedance of the reception-side input unit circuit and the output impedance of the bias application circuit are set so that a cutoff frequency of the high-pass filter and a capacitance of the capacitor become desired values, respectively.

6. The IC chip according to claim 2, further comprising:
an inductor inserted in series to the signal line.

7. The IC chip according to claim 2, further comprising:
a second transmission line inserted in series to the signal line, the second transmission line having a characteristic impedance of not less than 50Ω.

8. An IC chip comprising:
a pad connected to a first transmission line outside the chip;
a signal line, one end of which is connected to the pad;
a termination resistor connected to the other end of the signal line and configured to terminate the first transmission line;
a reception-side input unit circuit configured to receive a signal transmitted from a transmission-side via the first transmission line;
a capacitor inserted between a node of the signal line and the termination resistor and an input terminal of the reception-side input unit circuit, and
a second transmission line inserted in series to the signal line, the second transmission line having a characteristic impedance of not less than 50Ω.

9. The IC chip according to claim 8, further comprising:
a first inductor inserted in series to the signal line between the pad and the second transmission line; and a second inductor inserted in series to the signal line between the second transmission line and the node of the signal line and the termination resistor.

10. The IC chip according to claim 9, wherein the second transmission line includes two transmission lines which are connected in series, and the IC chip further comprises an electrostatic discharge protection circuit which is connected to a signal line between the two transmission lines.

11. An IC chip comprising:

a pad connected to a first transmission line outside the chip;

a signal line, one end of which is connected to the pad;

a termination resistor connected to the other end of the signal line and configured to terminate the first transmission line;

a reception-side input unit circuit configured to receive a signal transmitted from a transmission-side via the first transmission line;

a capacitor inserted between a node of the signal line and the termination resistor and an input terminal of the reception-side input unit circuit; and a bias application circuit configured to apply a DC bias voltage to the input terminal of the reception-side input unit circuit, wherein a high-pass filter is formed by the capacitor and a combined resistance of an input impedance of the reception-side input unit circuit and an output impedance of the bias application circuit, and the input impedance of the reception-side input unit circuit and the output impedance of the bias application circuit are set so that a cutoff frequency of the high-pass filter and a capacitance of the capacitor become desired values, respectively.

12. The IC chip according to claim 11, further comprising:

an inductor inserted in series to the signal line.

13. The IC chip according to claim 11, further comprising:

a second transmission line inserted in series to the signal line, the second transmission line having a characteristic impedance of not less than 50Ω.

* * * * *